US007745248B2

(12) United States Patent
Park et al.

(10) Patent No.: US 7,745,248 B2

(45) Date of Patent: Jun. 29, 2010

(54) FABRICATION OF CAPACITIVE MICROMACHINED ULTRASONIC TRANSDUCERS BY LOCAL OXIDATION

(75) Inventors: Kwan Kyu Park, Stanford, CA (US); Mario Kupnik, Mountain View, CA (US); Butrus T. Khuri-Yakub, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 85 days.

(21) Appl. No.: 12/288,009

(22) Filed: Oct. 14, 2008

(65) Prior Publication Data

US 2009/0142872 A1 Jun. 4, 2009

Related U.S. Application Data

(60) Provisional application No. 60/999,657, filed on Oct. 18, 2007.

(51) Int. Cl.
*H01L 21/00* (2006.01)

(52) U.S. Cl. .......................... 438/50; 438/53; 438/444; 257/E21.211

(58) Field of Classification Search .................. 438/48, 438/50, 53, 438, 444; 257/E21.211
See application file for complete search history.

(56) References Cited

U.S. PATENT DOCUMENTS

| | | | | |
|---|---|---|---|---|
| 3,595,719 A | | 7/1971 | Pomerantz | |
| 4,247,352 A | | 1/1981 | Stupp et al. | |
| 4,551,910 A | | 11/1985 | Petterson | |
| 5,490,034 A | | 2/1996 | Zavracky et al. | |
| 5,834,332 A | * | 11/1998 | Hierold et al. | 438/48 |
| 5,982,709 A | | 11/1999 | Ladabaum et al. | |
| 6,159,762 A | * | 12/2000 | Scheiter et al. | 438/53 |

(Continued)

FOREIGN PATENT DOCUMENTS

WO WO 2006/134580 12/2006

(Continued)

OTHER PUBLICATIONS

Lasky, "Wafer bonding for silicon-on-insulator technologies," Appl. Phys. Lett. 48 (1), Jan. 1986.

(Continued)

*Primary Examiner*—Tuan N. Quach
(74) *Attorney, Agent, or Firm*—Lumen Patent Firm

(57) ABSTRACT

The current invention provides methods of fabricating a capacitive micromachined ultrasonic transducer (CMUT) that includes oxidizing a substrate to form an oxide layer on a surface of the substrate having an oxidation-enabling material, depositing and patterning an oxidation-blocking layer to form a post region and a cavity region on the substrate surface and remove the oxidation-blocking layer and oxide layer at the post region. The invention further includes thermally oxidizing the substrate to grow one or more oxide posts from the post region, where the post defines the vertical critical dimension of the device, and bonding a membrane layer onto the post to form a membrane of the device. A maximum allowed second oxidation thickness $t_2$ can be determined, that is partially based on a desired step height and a device size, and a first oxidation thickness $t_1$ can be determined that is partially based on the determined thickness $t_2$.

23 Claims, 16 Drawing Sheets

U.S. PATENT DOCUMENTS

| | | | | |
|---|---|---|---|---|
| 6,320,239 | B1 | 11/2001 | Eccardt et al. | |
| 6,443,901 | B1 | 9/2002 | Fraser | |
| 6,570,196 | B1 * | 5/2003 | Fromherz et al. | 257/213 |
| 6,958,255 | B2 | 10/2005 | Khuri-Yakub et al. | |
| 2005/0223783 | A1 * | 10/2005 | Spivak | 73/54.14 |

FOREIGN PATENT DOCUMENTS

| | | |
|---|---|---|
| WO | WO 2007/044482 | 4/2007 |

OTHER PUBLICATIONS

Schmidt, "Wafer-to-Wafer Bonding for Microstructure Formation," Proceedings of the IEEE 86 (8), Aug. 1998.

Huang et a., "Fabricating Capacitive Micromachined Ultrasonic Transducers With Wafer-Bonding Technology," J. MEMS, 12 (2), Apr. 2003.

Appels et al., "Local Oxidation of Silicon and Its Application in Semiconductor-device technology," Philips Res. Rep., 25 (2), pp. 118, (1970).

Gui et al., "The effect of surface roughness on direct wafer bonding," J. Appl. Phys. 85 (1), May 1999.

Miki et al., "Effect of Nanoscale surface roughness on the bonding energy of direct-bonded silicon wafers," J. Appl. Phys. 94 (10), Nov. 2003.

Ergun et al., "Capacitive Micromachined Ultrasonic Transducers: Fabrication Technology," IEEE Trans. on Ultrason., Ferr., Freq. Cont., 52 (12), Dec. 2005.

Ergun et al., "Capacitive Micromachined Ultrasonic Transducers: Theory and Technology," J. Aero. Eng. 16 (2), Apr. 2003.

Khuri-Yakub et al., "The Capacitive Micromachined Ultrasonic Transducer (CMUT) as a Chem/Bio Sensor," IEEE Ultrasonics Symposium Oct. 28-31, 2007.

Park et al., "Fabricating Capacitive Micromachined Ultrasonic Transducers with Direct Wafer-Bonding and LOCOS Technology," IEEE 21st International Conference on Micro Electro Mechanical Systems, Jan. 13-17, 2008.

Deal et al., "General Relationship for the Thermal Oxidation of Silicon," J. Appl. Phys. 36 (12), Dec. 1965.

* cited by examiner

FABRICATION OF CAPACITIVE MICROMACHINED ULTRASONIC TRANSDUCERS BY LOCAL OXIDATION

CROSS-REFERENCE TO RELATED APPLICATIONS

This application claims priority from U.S. Provisional Patent Application 60/999,657 filed Oct. 18, 2007, which is incorporated herein by reference.

FEDERALLY-SPONSORED RESEARCH OR DEVELOPMENT

This invention was made with Government support under contract N66001-06-1-2030 awarded by the Space and Naval Warfare Systems Center. The Government has certain rights in this invention.

FIELD OF THE INVENTION

The invention relates generally to capacitive micromachined ultrasonic transducers (CMUTs). More particularly, the present invention relates to fabrication of CMUTs by local oxidation.

BACKGROUND

Capacitive micromachined ultrasonic transducers (CMUTs) are gaining increasing popularity in the fields of medical and underwater imaging. In addition, CMUT technology has recently been used for applications such as high intensity focused ultrasound (HIFU) therapy and resonating chemical sensors. The basic structure of a CMUT includes a thin membrane and a support substrate separated by a vacuum cavity. Typically, a doped silicon substrate makes up the bottom electrode of the capacitor and a conducting membrane acts as the top electrode. The membrane vibrates when excited with an electrical AC signal. Conversely, an electrical signal is generated when the membrane vibrates due to impinging sound waves.

CMUTs were originally fabricated using a sacrificial release process. In this process, a silicon nitride membrane layer is deposited on a patterned sacrificial polysilicon layer; the polysilicon is subsequently removed via small channels; and then the resulting gap is vacuum sealed by a second silicon nitride layer deposited on top of the membrane; the final membrane thickness is set by etching back the second nitride layer. This technique has numerous intrinsic drawbacks, including: stiction problems that may prevent the release of the membrane; stress in the membrane that is very sensitive to deposition conditions; difficulties in controlling the membrane thickness due to successive deposition and etching steps; and difficulties to control the gap height or thickness due to the unwanted non-uniform nitride deposition in the cavity during sealing.

More recently, CMUT fabrication processes were developed utilizing a direct wafer bonding (fusion bonding) technique. In this technique, the vacuum cavities are formed by etching an oxide layer before the wafer is bonded to a silicon-on-insulator (SOI) wafer in a vacuum chamber. After removing the handle wafer and the buried oxide (BOX) layer of the SOI wafer, a single crystal silicon layer remains as the CMUT membrane with good uniformity and without significant residual stress. However, since the gap height is determined through an etching process, gap height control is difficult. In addition, the minimum gap height is limited by the thickness of the original oxide layer, requiring design compromise in terms of breakdown voltage and parasitic capacitance.

The present invention addresses at least the difficult problems of fabricating CMUTs and advances the art with a method of fabricating a CMUT using local oxidation.

SUMMARY OF THE INVENTION

The present invention is directed to methods of fabricating devices having a vertical critical dimension, such as a capacitive micromachined ultrasonic transducer (CMUT). The method includes depositing an oxidation-blocking layer, such as a silicon-nitride layer, onto a substrate of an oxidation-enable material, such as a silicon substrate having low surface roughness. The oxidation-blocking layer is patterned to form a post region and a cavity region, where the oxidation-blocking layer is removed from the substrate at the post region.

The substrate is then thermally oxidized, such as through a LOCOS process, to grow one or more oxide posts from the post region, where the grown oxide post defines a vertical dimension of the device. A membrane layer is then bonded to the post, preferably through fusion bonding. In a preferred embodiment of the invention, the substrate is oxidized before the deposition of the oxidation-blocking layer. Oxidizing forms an oxide layer on a surface of the substrate. In this embodiment, patterning removes the oxide layer in addition to the oxidation-blocking layer from the post region. In an embodiment, patterning includes etching the oxidation-blocking layer by wet or dry etching and etching the oxide layer by wet etching.

In an embodiment, some of the oxide layer located at or near the boundary of the post and the cavity region is removed to define a horizontal size of the device or CMUT. In another embodiment, thermal oxidation of the substrate to grow the post forms a protrusion of the oxidation-blocking layer. Optionally, the protrusion can be removed. In an alternative embodiment, approximately all of the oxidation-blocking layer is removed from the cavity region. Additionally or alternatively, some of the oxide layer is removed to define a horizontal size of the device or CMUT.

In an embodiment, the substrate initially includes a substrate step, where the cavity region to be formed at least partially overlaps with the substrate step. The present invention is also directed to methods of introducing a substrate step to the substrate. An embodiment for introducing a substrate step includes oxidizing the substrate to form an oxide layer; depositing a temporary oxidation-blocking layer onto the oxide layer; patterning the temporary oxidation-blocking layer and the oxide layer to form an open region and a step region, wherein patterning removes the temporary oxidation-blocking layer and the oxide layer from the substrate at the open region; thermally oxidizing the substrate to consume the oxidation-enable material of the substrate at the open region and to grow one or more temporary oxide posts at the post region; and removing approximately all of the temporary oxidation-blocking layer, the oxide layer, and the temporary oxide posts.

In another embodiment, the substrate step introducing includes thermally oxidizing the substrate to form an oxide layer on the surface of the substrate; patterning the oxide layer to form an open region and a step region, wherein patterning removes the oxide layer from the substrate at the open region; thermally oxidizing the substrate and the patterned oxide layer; and removing approximately all of the oxide, whereby the remaining substrate has a step. In an embodiment, the over-etch time required in the removal of the oxide is minimized by first determining a maximum allowed value for the oxidation thickness in the second thermal oxidation step based on the desired step height and a size of the device. The oxidation thickness in the first thermal oxidation step is calculated based on the determined maximum allowed second oxidation thickness and the desired step height.

The present invention has numerous advantages over existing techniques of fabricating CMUTs by providing independent and precise gap thickness and post thickness control to allow for CMUTs with low parasitic capacitance and high breakdown voltage. The fabrication method of the present invention provides for cost-effective and highly reproducible devices. In addition, the fabrication method presented herein ensures smooth surface roughness without requiring any chemical-mechanical polishing.

BRIEF DESCRIPTION OF THE FIGURES

The present invention together with its objectives and advantages will be understood by reading the following description in conjunction with the drawings, in which.

DETAILED DESCRIPTION OF THE INVENTION

Fabricating a capacitive micromachined ultrasonic transducer (CMUTs) with low parasitic capacitance and high breakdown voltage can be a daunting task. In addition, existing fabrication methods typically do not allow for independent gap and post thickness control, which are often required or desired for CMUTs in imaging, HIFU therapy, and sensing applications. The present invention is directed to methods of fabricating a CMUT or another device having a vertical critical dimension through local oxidation, such as local oxidation of silicon (LOCOS). It is important to note that the present invention maintains low surface roughness throughout the process steps to allow for effective membrane bonding, such as through fusion bonding.

The present invention is directed to a method of fabricating a device, such as a CMUT, using local oxidation. Though the figures and the description below are primarily directed to CMUT fabrication, the present invention is applicable to any device having a vertical critical dimension and/or requiring a cavity, such as MEMS and NEMS switches, electrostatic microphones, electrostatic pressure sensors, electrostatic actuators, micro mirrors and devices requiring encapsulation.

FIG. 1 shows an embodiment of the present invention for fabricating a CMUT. FIG. 1A shows a substrate 110 of an oxidation-enable material, such as silicon, poly silicon, gallium arsenide, indium phosphide, aluminum arsenide and silicon carbide. Preferably, the substrate 110 is a prime-quality silicon wafer having low surface roughness. In certain embodiments, the surface roughness should be sufficiently low for direct wafer bonding (also referred to as fusion bonding). In an embodiment, the surface of the substrate 110 has a root mean square (RMS) surface deviation less than about 25 nm, less than about 2 nm, or less than about 0.5 nm. The substrate 110 is oxidized to form an oxide layer 120 on a surface of the substrate 110. It is important to note that oxidizing does not significant degrade the surface roughness of the substrate 110.

Figure 1A:
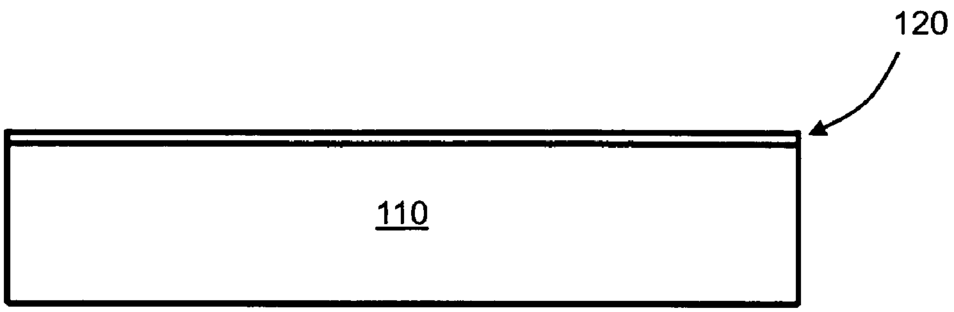
FIGS. 1A-1E show an example method of fabricating a CMUT by local oxidation according to the present invention.
Figure 1B:
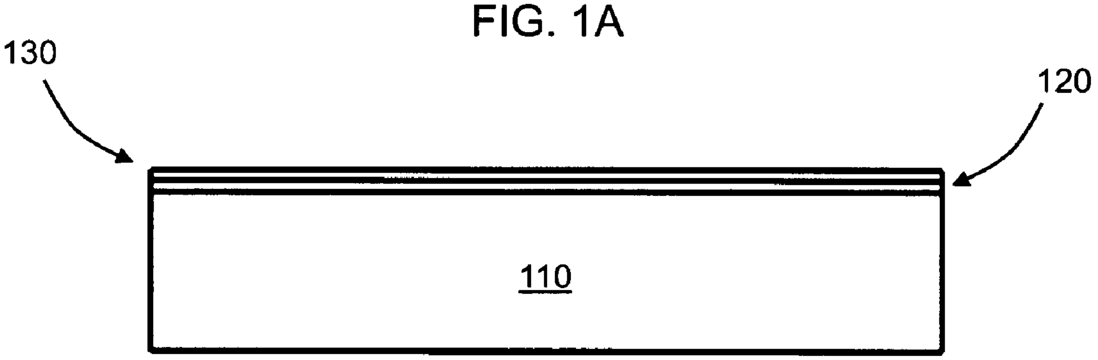
Figure 1C:
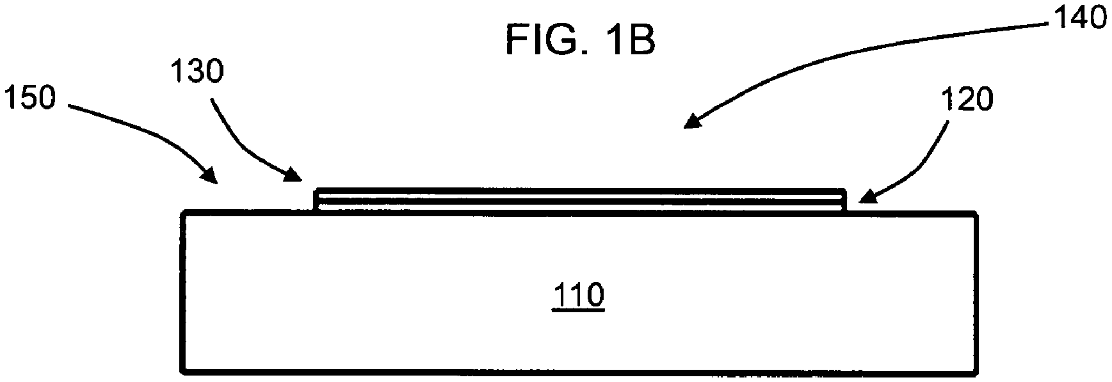

FIG. 1B shows an oxidation-blocking layer 130 deposited on the oxide layer 120 and the substrate 110. In a preferred embodiment, the oxidation-blocking layer 130 comprises silicon nitride, though any other oxidation-blocking material, such as silicon oxide, can also be used. As shown in FIG. 1C, the oxidation-blocking layer 130 and the oxide layer 120 are then patterned to form one or more post regions 150 and a cavity region 140, where the oxidation-blocking 130 and the oxide 120 layers are removed from the substrate 110 at the post region. In a preferred embodiment, patterning comprises wet or dry etching the oxidation-blocking layer 130 and wet etching the oxide layer 120. The oxide layer 120 is preferably etched with minimal over-etch time to avoid increasing the surface roughness of the substrate 110. For example, buffered oxide etchant (BOE) can be used for wet etching the oxide 120 layer with minimum over-etching time.

Figure 1D:
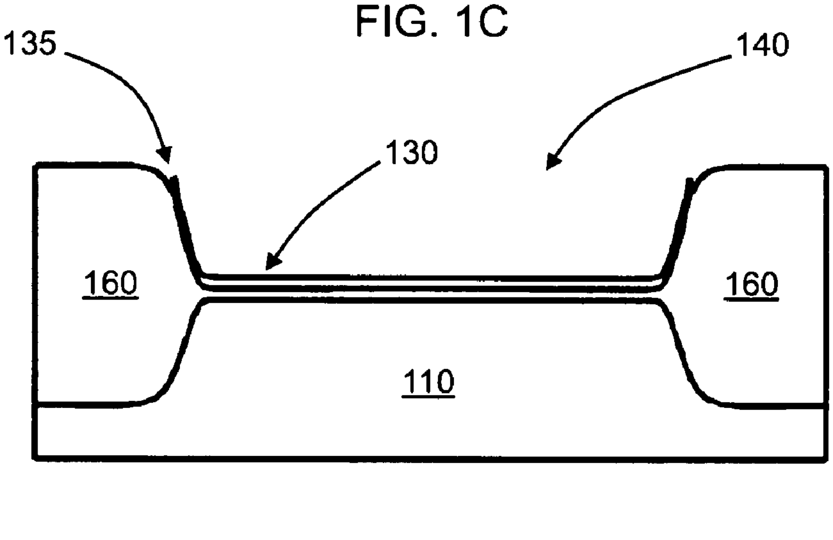

FIG. 1D shows the important step of thermally oxidizing the substrate 110. The substrate 110 is oxidized at the post region 150 to grow one or more oxide posts 160 for the device. Conversely, the oxidation-blocking layer 130 prevents the substrate 110 from being oxidized at the cavity region 140, thereby the posts 160 can have a greater height than the cavity region 140. The oxide posts 160 define a vertical critical dimension for the device. For embodiments having a silicon substrate, this step is referred to as local oxidation of silicon (LOCOS).

Figure 1E:
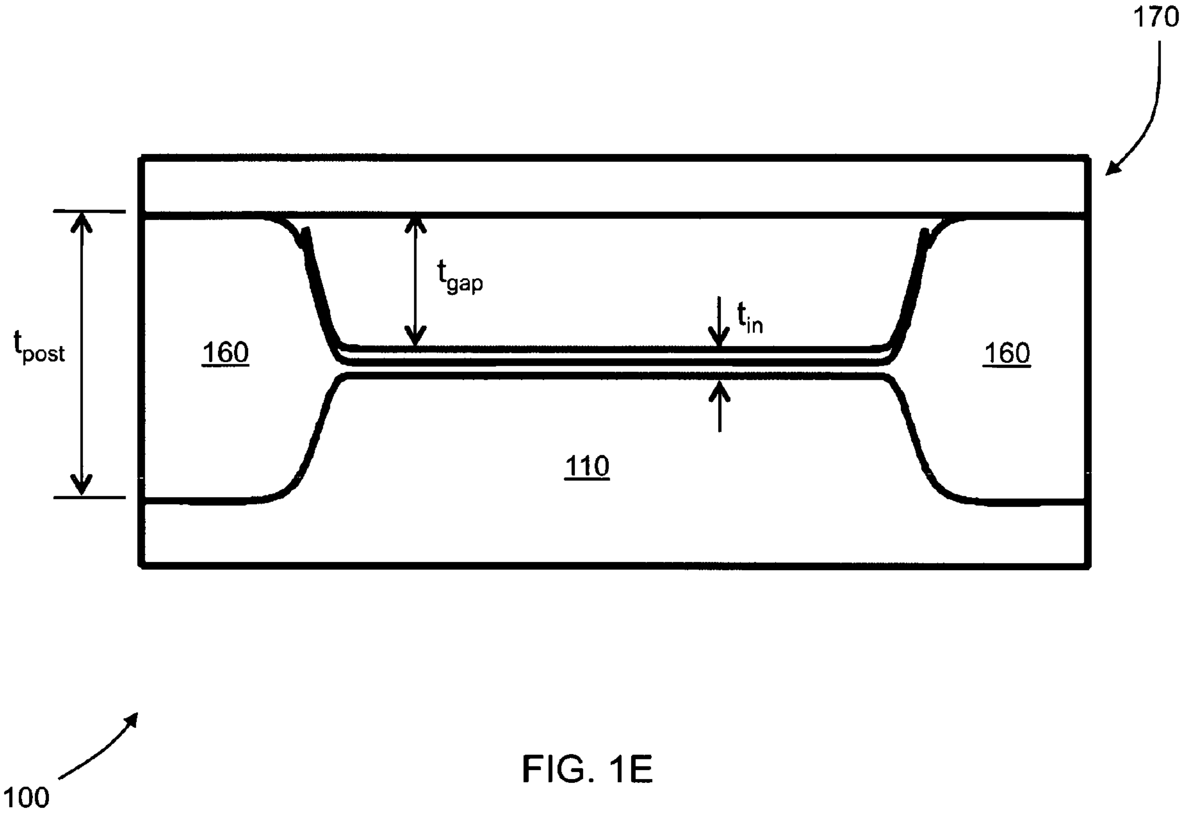

Thermal oxidization generally forms a protrusion 135 of the oxidation-blocking layer 130 located approximately near the boundary of the post 160 and the cavity region 140. When the posts 160 extend above the protrusion 135, a membrane layer 170 can be bonded to a top surface of the posts 160, as shown in FIG. 1E. Since the posts 160 are grown through thermal oxidation, the top surface of the posts 160 maintains a low surface roughness. In an embodiment, the surface roughness of the top surface of the posts 160 has a RMS deviation less than about 25 nm, less than about 2 nm, or, preferably, less than about 0.5 nm. The low surface roughness allows the membrane layer 170 to be bonded through direct wafer bonding or fusion bonding, however, other bonding techniques can also be used. In an embodiment, the membrane layer 170 comprises a material selected from a group consisting of doped or undoped single crystal silicon, doped or undoped polysilicon, doped or undoped silicon carbide, conductive or nonconductive diamond, metal, and silicon nitride.

FIG. 1E shows an embodiment of a finished CMUT 100 fabricated as described above. By growing the posts 160 through thermal oxidation, the post thickness $t_{post}$ can be determined by the amount of oxidizing time and the oxidizing parameters. This is in contrast to existing CMUT fabrication processes where the vertical dimension is determined by etching and is limited by an oxide layer thickness prior to etching. In the embodiment of FIG. 1E, the gap thickness $t_{gap}$ is related to the post thickness $t_{post}$ through the equation: $t_{gap}=c\ t_{post}-t_{in}$, where c is a constant related to the oxidation parameters and $t_{in}$ is the thickness of the insulating layer defined by the combination of the oxide layer and the oxidation-blocking layer thicknesses. In an exemplary embodiment, c is approximately equal to 0.56.

Figure 2A:
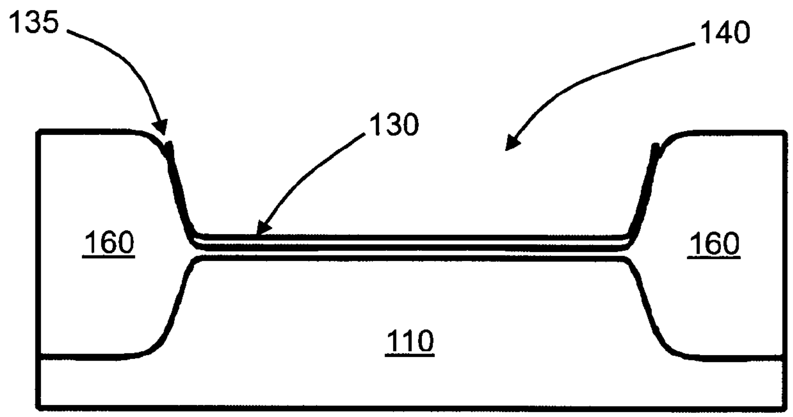
FIGS. 2A-2C show an optional step to the example process of FIGS. 1A-1E according to the present invention.
Figure 2B:
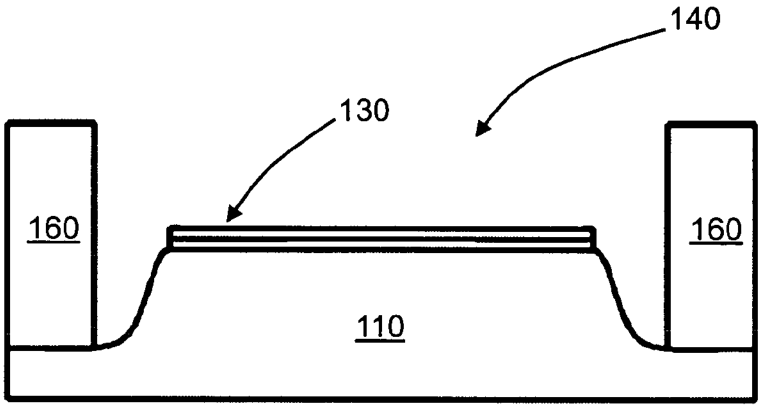
Figure 2C:
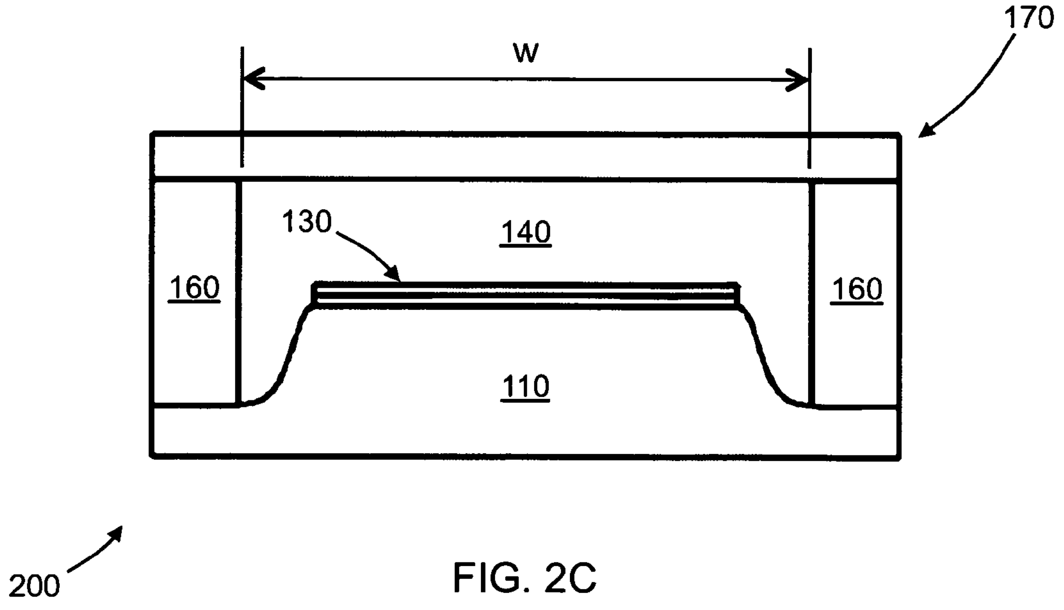
Figure 3A:
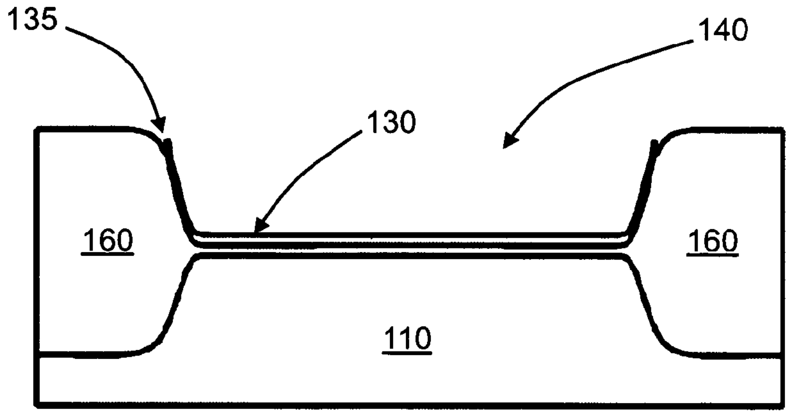
FIGS. 3A-3C show another optional step to the example process of FIGS. 1A-1E according to the present invention.

FIGS. 2-3 show optional steps to the fabrication method of FIG. 1. The steps preceding FIGS. 2A and 3A are similar to the steps shown in FIGS. 1A-1D. Instead of directly bonding the membrane layer onto the posts 160, FIGS. 2-3 show optional intermediate steps of changing the oxide and/or the oxidation-blocking layer 130. FIGS. 2B-C show the removal of the protrusion 135 of the oxidation-locking layer 130 before the membrane layer 170 is bonded onto the posts. This step may be necessary in embodiments where the protrusion 135 extends above the grown oxide posts 160, however the protrusion 135 can be removed or partially removed even if it does not extend above the posts 160. Additionally or alternatively, some of the oxide located at or near the boundary of the post 160 and the cavity region 140 can be removed, such as through etching. In an embodiment, the removal of oxide near the boundary of the post 160 and the cavity region 140 defines a horizontal size w, such as a diameter, of the CMUT 200. When the horizontal size w is defined, effective size of the membrane is more precisely controlled or the design of the membrane can be more flexible. Furthermore, removing some of the oxide and/or the protrusion 135 has advantages for reliability, parasitic capacitance, and fabrication limits.

Figure 3B:
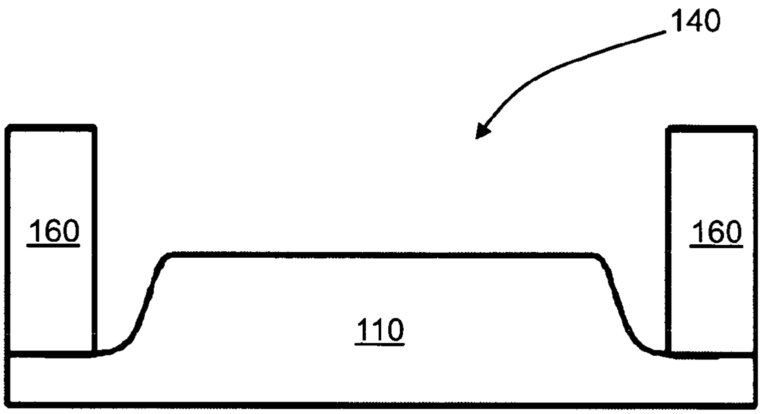
Figure 3C:
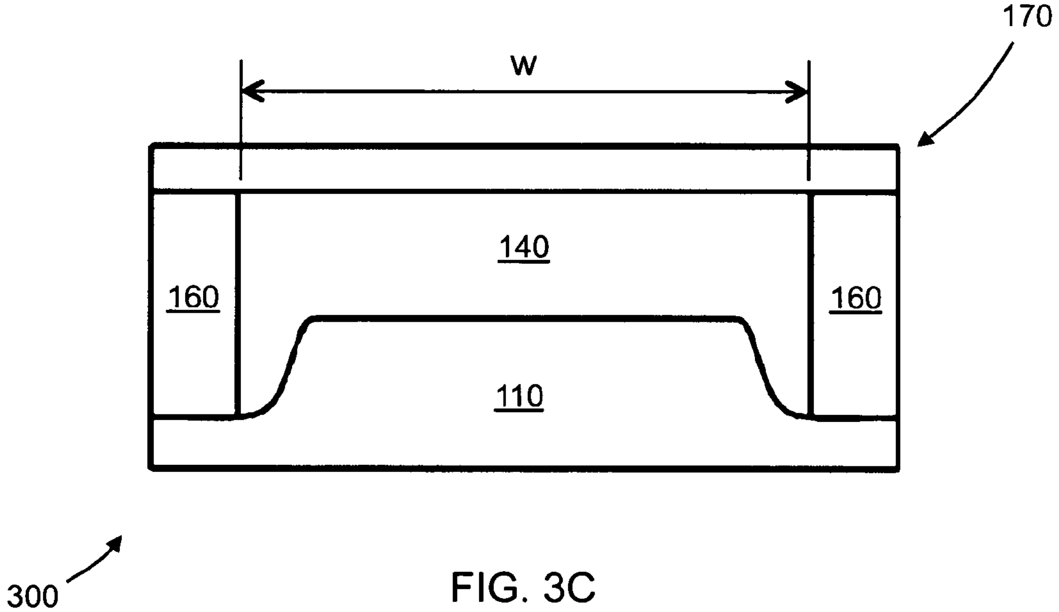

FIGS. 3B-C show an embodiment in which approximately all of the oxidation-blocking layer 130 is removed. Some of the oxide located at or near the boundary of the post 160 and the cavity region 140 can be additionally or alternatively removed. As in the embodiments shown in FIG. 2, this removal can allow for the definition of a horizontal size w. It is noted that the CMUT 300 shown in FIG. 3C does not have an insulating layer between the substrate 110 and the membrane layer 170, therefore, may be useful for applications where no contact between the electrodes can occur.

Figure 4A:
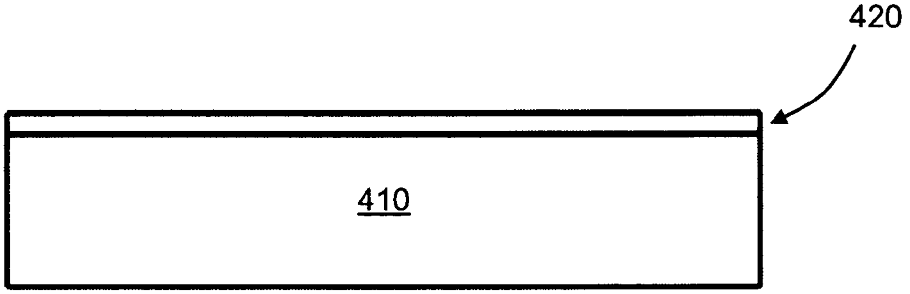
FIGS. 4A-4D show another example method of fabricating a CMUT according to the present invention.
Figure 4B:
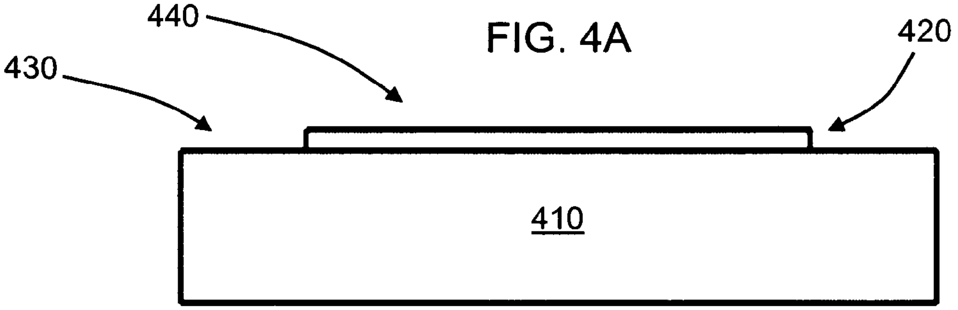
Figure 4C:
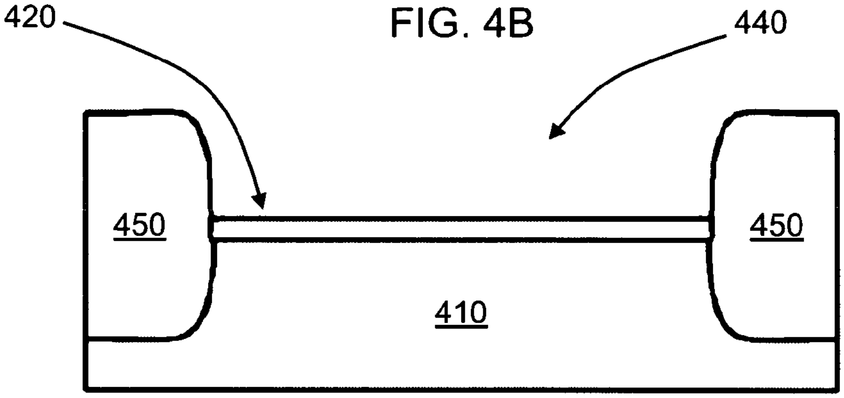

FIGS. 4A-D show an alternative fabrication process to the process of FIGS. 1A-E with the primary difference being the absence of an initial oxidation step of the substrate 410; FIG. 4A shows an oxidation-blocking layer 420 deposited directly onto the substrate 410. Similar to the embodiment of FIG. 1, the substrate 410 comprises an oxidation-enable material, such as silicon. In a preferred embodiment, the oxidation-blocking layer 420 comprises silicon nitride. The oxidation-blocking layer is then patterned to form a post region 430 and a cavity region 440, as shown in FIG. 4B. FIG. 4C shows a thermal oxidation step of the substrate 410 to grow oxide posts 450 at the post region. The oxidation-blocking layer 420 prevents oxidation of the substrate 410 at the cavity region 440.

Figure 4D:
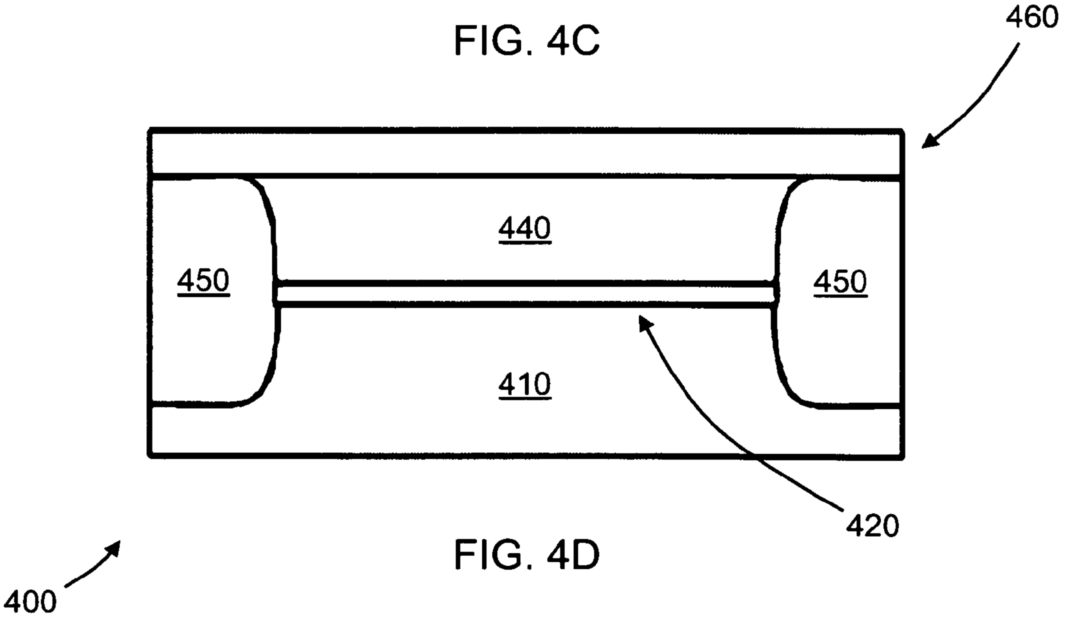
Figure 5:
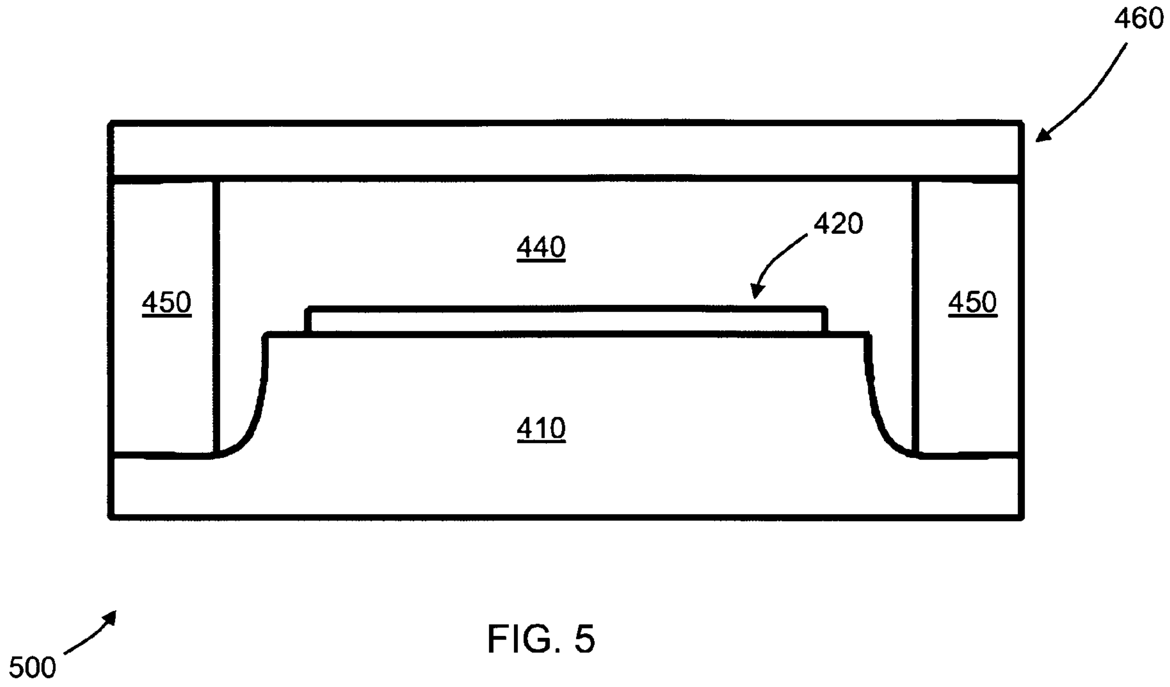
FIG. 5 shows an optional step to the example process of FIG. 4 according to the present invention.
Figure 6:
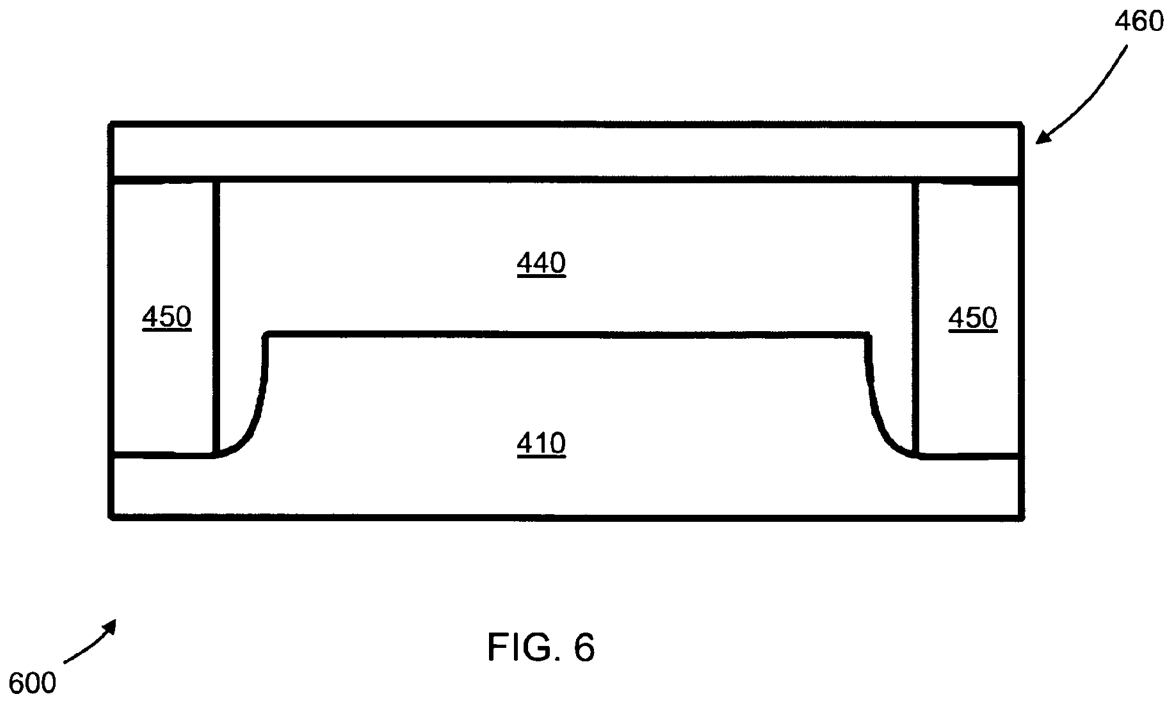
FIG. 6 shows another optional step to the example process of FIG. 4 according to the present invention.

FIG. 4D shows an embodiment where the membrane layer 460 is deposited onto the posts 450 immediately after the growth of the posts 450. FIGS. 5-6 show alternative embodiments where the oxidation-blocking layer 420 and the oxide posts 450 are at least partially removed near the boundary between the posts 450 and the cavity region 440. For CMUT 500, the oxidation-blocking layer 420 is partially etched near the boundary with the posts, whereas for CMUT 600, the oxidation-blocking layer is completely removed from the substrate 410. In both FIGS. 5 and 6, the oxide posts 450 are partially etched to define a horizontal dimension of CMUT 500 and 600, respectively. It is important to note that embodiments of the present invention include the removal of any or the entire oxidation-blocking layer 420 in addition to the removal of any amount of the oxide posts 450.

In preferred embodiments of the present invention, the substrate forming the bottom electrode of the CMUT is non-planar. FIGS. 7-12 show fabrication methods analogous to the methods of FIGS. 1-6, however, the substrate of FIGS. 7-12 include a substrate step. Preferably, the initial substrate step at least partially overlaps with the cavity of the CMUTs fabricated by the methods of FIGS. 7-12.

Figure 7A:
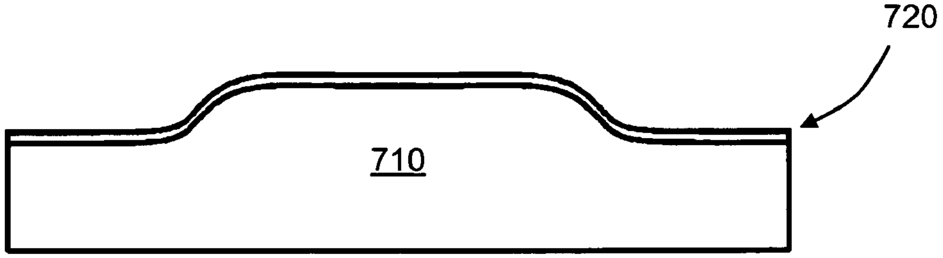
FIGS. 7A-7E show an example process of fabricating a CMUT with a substrate having a step according to the present invention.
Figure 7B:
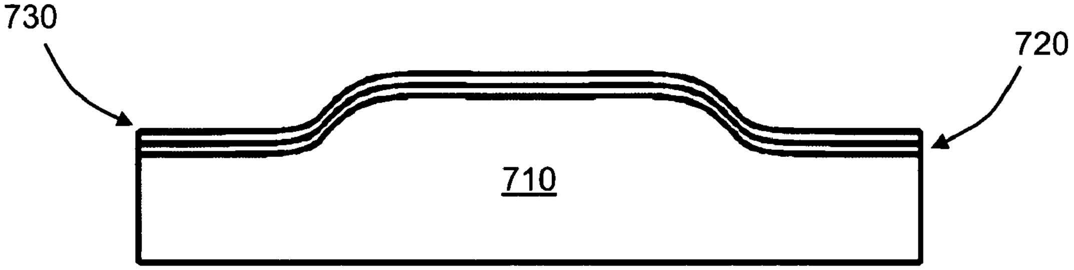
Figure 7C:
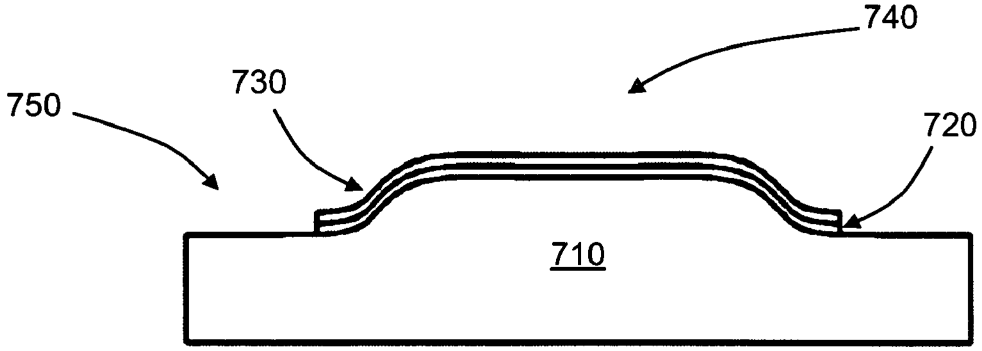
Figure 7D:
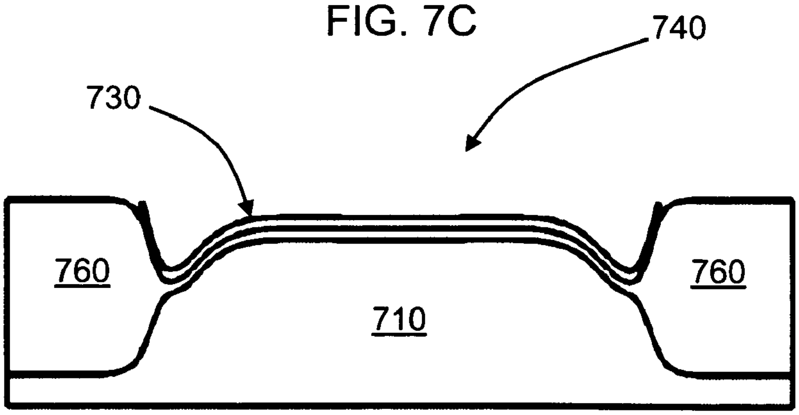
Figure 7E:
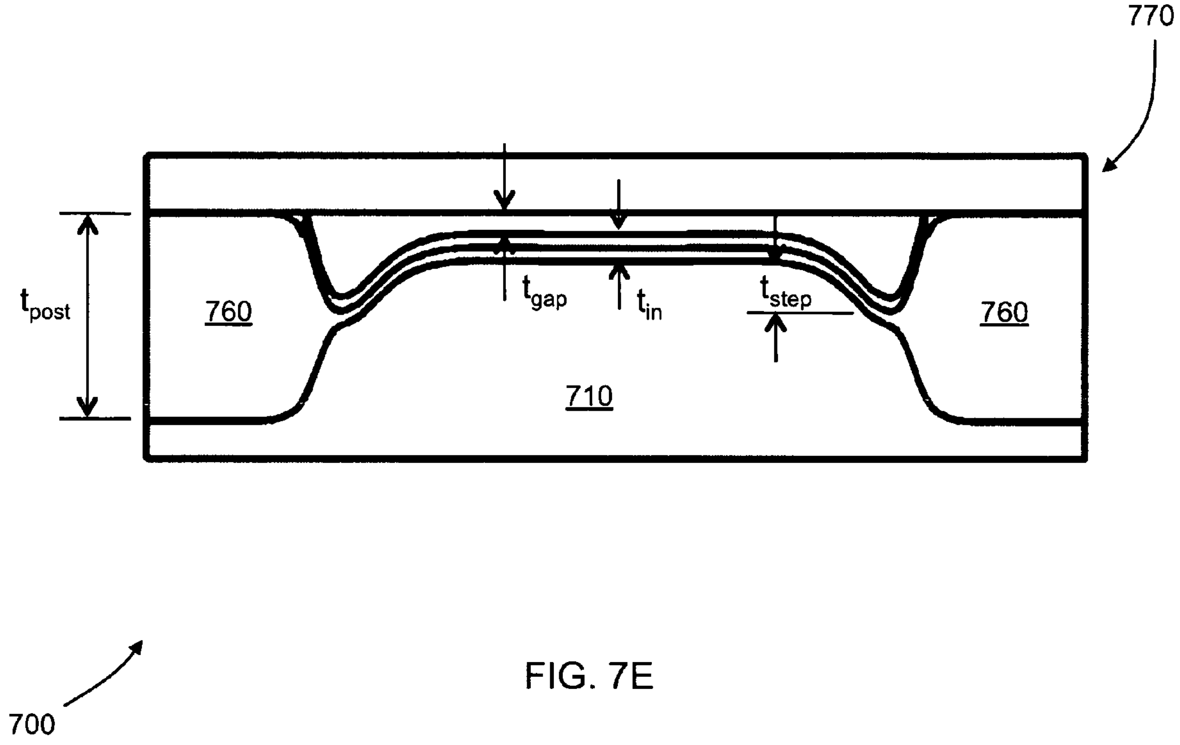

FIGS. 7A-E correspond to FIGS. 1A-E with the exception of an initially non-planar substrate 710. The substrate 710 is oxidized to form an oxide layer 720 on a surface of the substrate 710, and an oxidation-blocking layer 730 is deposited on the oxide layer 720. Both, oxidation-blocking layer 730 and oxide layer 720, are patterned to form a post region 750 and a cavity region 740. Preferably, the cavity region 740 overlaps the substrate step. The substrate 710 is then thermally oxidized to form oxide posts 760 that define a vertical critical dimension of the device 700. In a preferred embodiment, the posts 760 are grown from a silicon substrate 710 through LOCOS. FIG. 7E shows a membrane layer 770 bonded to the top surface of the oxide posts 760.

It is important to note that the fabrication method of FIG. 7 can provide a CMUT 700 with a larger ratio of post thickness $t_{post}$ to gap thickness $t_{gap}$ than CMUT 100 of FIG. 1. For example, a CMUT was fabricating having a post thickness of 700 nm and a gap thickness of only about 40 nm. Large ratios of post thickness $t_{post}$ to gap thickness $t_{gap}$ are beneficial for many applications, such as a CMUT imaging device and a CMUT resonator for a chemical sensor.

It is also important to note that fabrication methods having an initial substrate step also allows for independent gap and post thickness control. Independent gap and post thickness control can be attributed to the fact that the gap thickness $t_{gap}$ is dependent on the post thickness $t_{post}$ and the step thickness $t_{step}$, as is shown by the equation: $t_{gap}=c\ t_{post}-t_{in}-t_{step}$, where c is a constant relating to oxidation parameters, such as oxidation temperature or pressure. By having the step thickness as an extra degree of design freedom, the design of the CMUT can include a desired post thickness that is largely unrestrained by the desired gap thickness.

Figure 8:
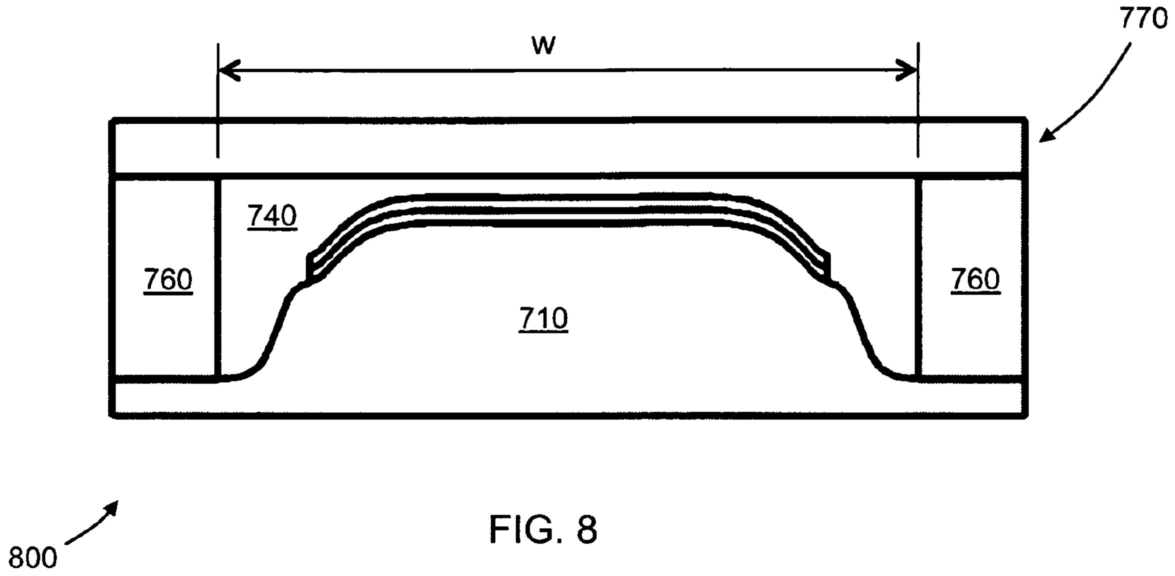
FIG. 8 shows an optional step to the example process of FIG. 7 according to the present invention.
Figure 9:
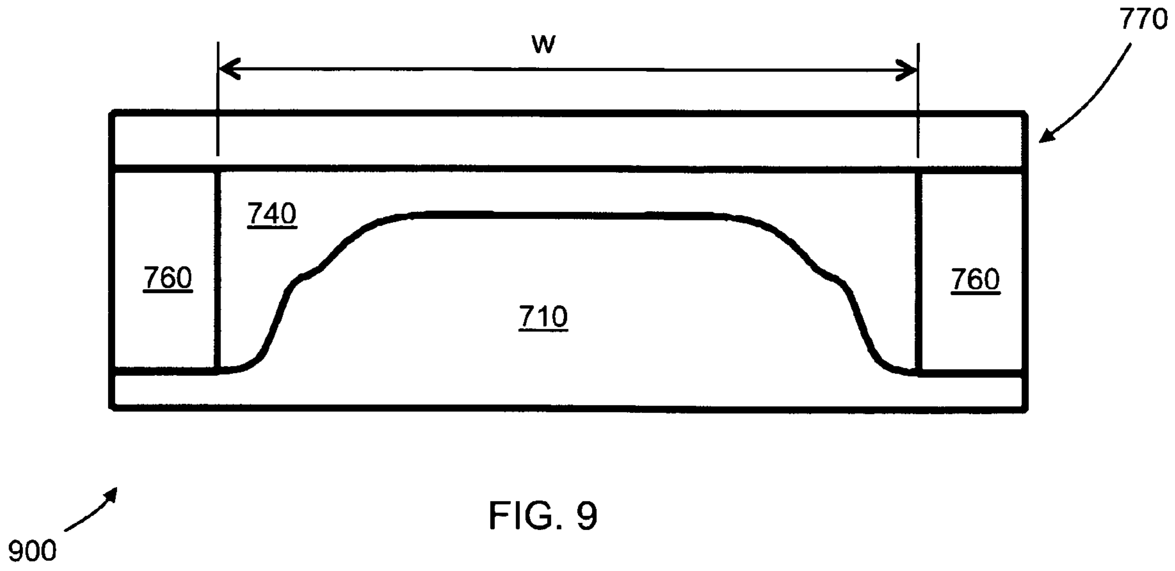
FIG. 9 shows another optional step to the example process of FIG. 7 according to the present invention.

FIGS. 8 and 9 show CMUTs 800 and 900, respectively, similar to CMUT 700, but after additional steps of removing some of or the entire oxidation-blocking layer 730. In addition, some of the oxide has been removed from the oxide posts 760 of CMUTs 800 and 900 to define a horizontal size w to the CMUTs.

FIGS. 10A-D correspond to FIGS. 4A-E, with the exception of an initially non-planar substrate 1010. In the embodiment shown by FIGS. 10A-D, an oxidation-blocking layer 1020 is deposited directly on the non-planar substrate 1010.

Figure 10A:
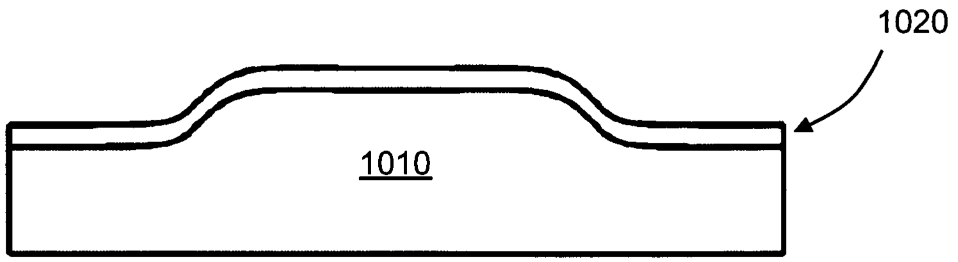
FIGS. 10A-10D show another example process of fabricating a CMUT with a substrate having a step according to the present invention.
Figure 10B:
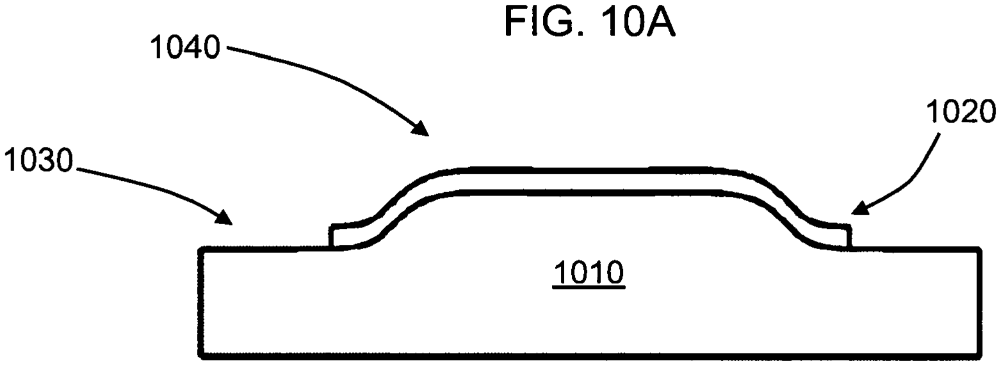
Figure 10C:
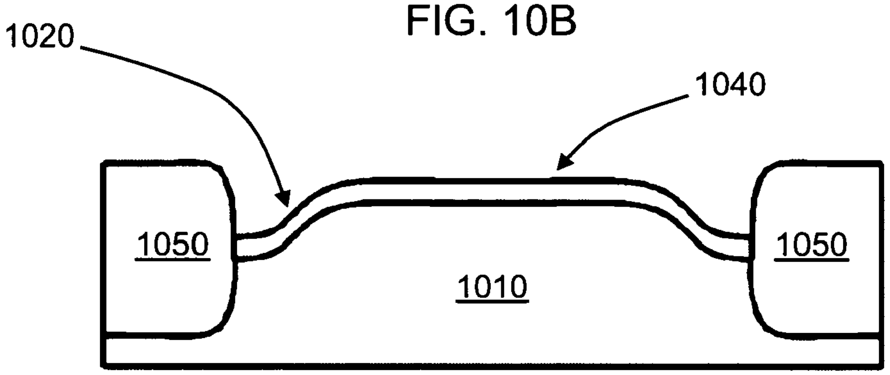
Figure 10D:
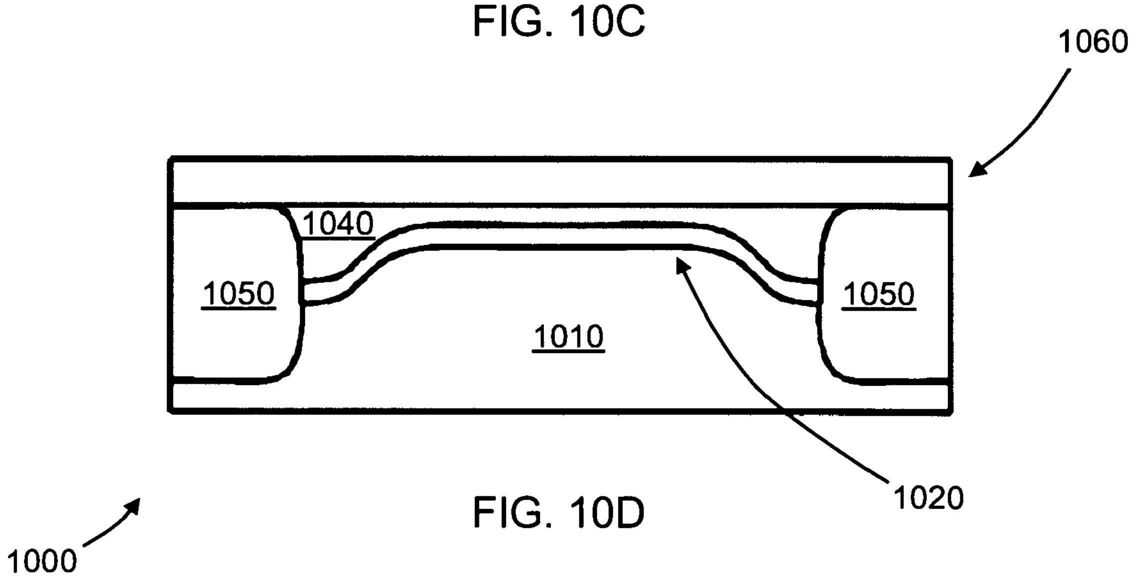

The oxidation-blocking layer 1020 is patterned to form a post region 1030 and a cavity region 1040. Preferably, the cavity region 1040 overlaps the substrate step. The substrate 1010 is then thermally oxidized to form oxide posts 1050 that define a vertical critical dimension of the device 1000. In a preferred embodiment, the posts 1050 are grown from a silicon substrate 1010 through LOCOS. FIG. 10D shows a membrane layer 1060 bonded to the top surface of the oxide posts 1050.

Figure 11:
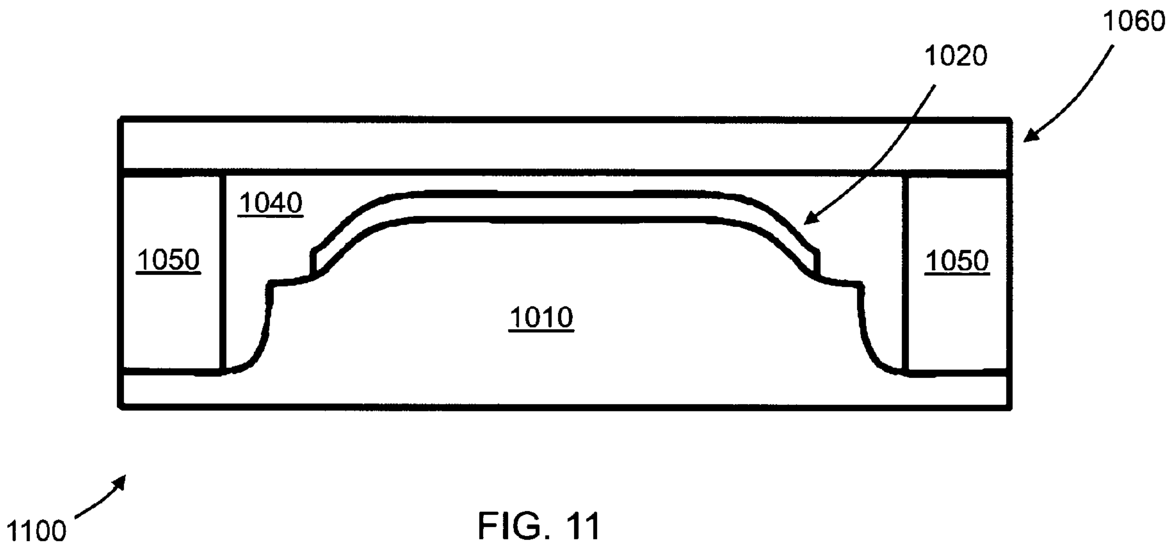
FIG. 11 shows an optional step to the example process of FIG. 10 according to the present invention.
Figure 12:
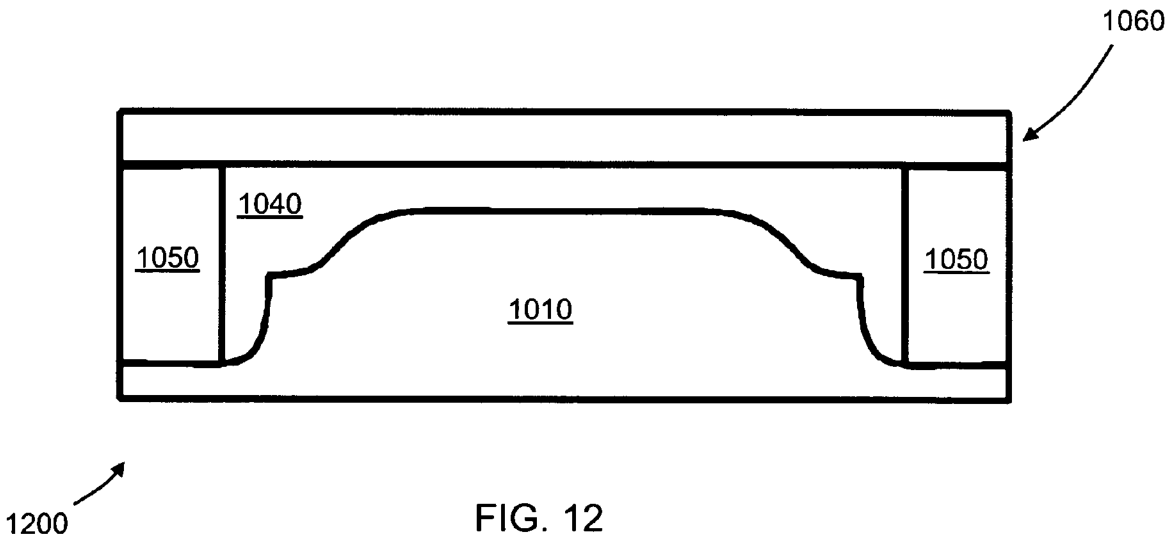
FIG. 12 shows another optional step to the example process of FIG. 10 according to the present invention.

FIGS. 11 and 12 show CMUTs 1100 and 1200, respectively, similar to CMUT 1000, but after optional steps of removing some of or the entire oxidation-blocking layer 1020. In addition, some of the oxide has been removed from the oxide posts 1060 of CMUTs 800 and 900 to define a horizontal size w to the CMUTs.

The present invention is directed to embodiments having an existing substrate step, including the fabrication methods of FIGS. 7 and 10. However, the present invention is also directed to methods of fabricating a substrate step. The fabricated substrate step can be used in CMUT devices or any devices wherein a non-planar substrate may be required or desired. FIG. 13 shows a first embodiment of a method of fabricating a substrate step using local oxidation and a patterned oxidation-blocking layer. If the substrate comprises silicon, the embodiment of FIG. 13 can be based on LOCOS. FIG. 14 shows another embodiment of a method of introducing a step to a substrate using local oxidation without requiring an oxidation-blocking layer. The embodiments shown in FIGS. 13-14 can be combined with any of the embodiments shown in FIGS. 7-12 or any other fabrication method utilizing a non-planar substrate. It is noted that the step introducing processes of FIGS. 13-14 can be repeated any number of times. In addition, the processes shown in FIGS. 13-14 can be used in combination with each other.

Figure 13A:
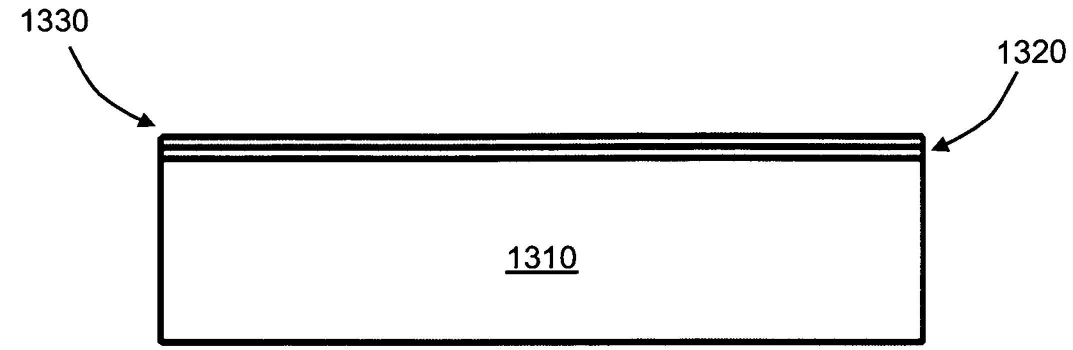
FIGS. 13A-13D show an example process of fabricating a step on a substrate from double local oxidation according to the present invention.
Figure 13B:
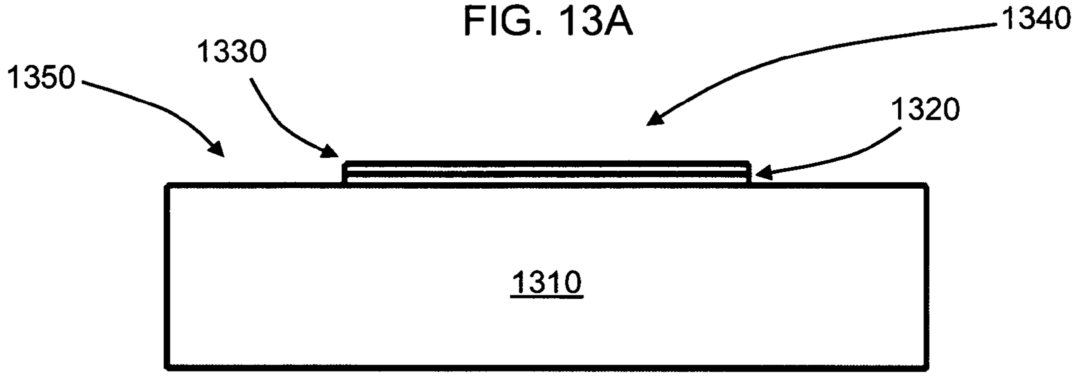

FIG. 13A shows a substrate 1310 comprising an oxidation-enable material, such as silicon. The substrate 1310 is oxidized to form an oxide layer 1320, and a temporary oxidation-blocking layer 1330 is deposited on the oxide layer 1320. The oxidized surface of the substrate 1310 may be initially approximately uniform or it may be non-planar. In FIG. 13B, the oxidation-blocking layer 1330 and the oxide layer 1320 are patterned to form a step region 1340 and an open region 1350. In an embodiment, the oxidation-blocking layer 1330 is etched by dry or wet etching and the oxide-layer 1320 is etched by wet etching. Wet etching, including BOE, with minimal over-etch time is preferred for oxide-layer 1320 in order to avoid an increase in the surface roughness of the substrate 1310 at the open region 1350.

Figure 13C:
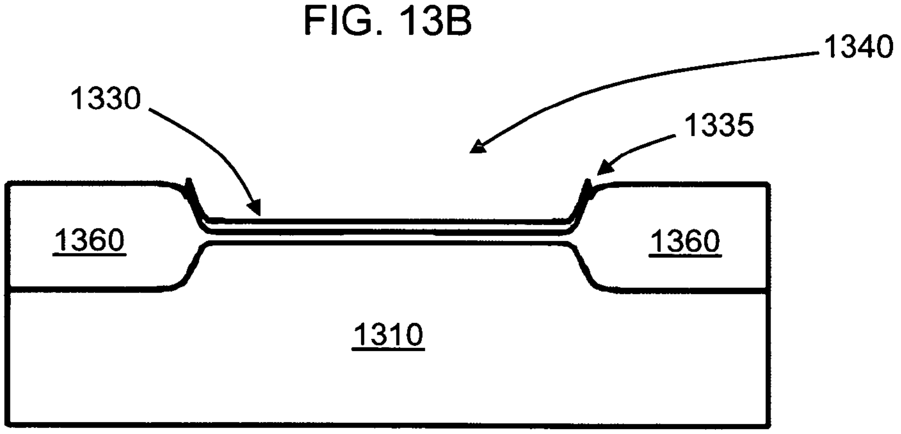
Figure 13D:
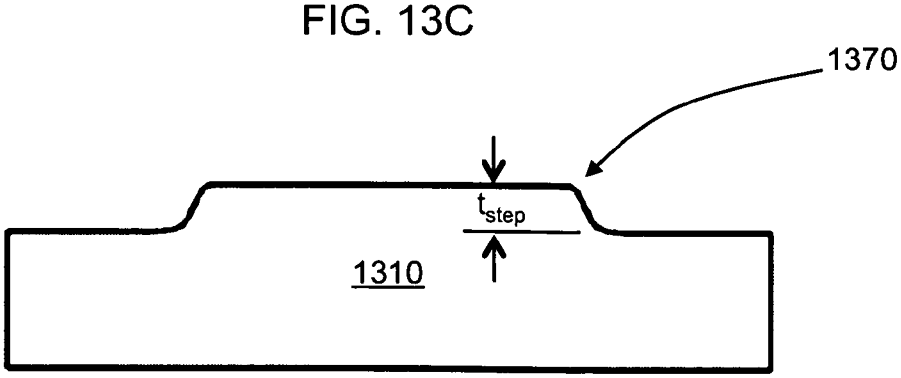
Figure 14A:
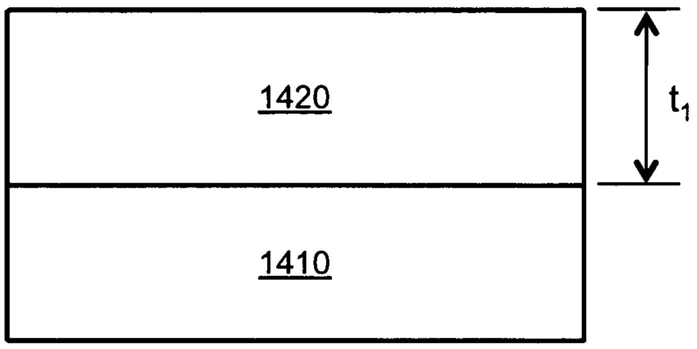
FIGS. 14A-14D show an example process of fabricating a step on a substrate according to the present invention.
Figure 14B:
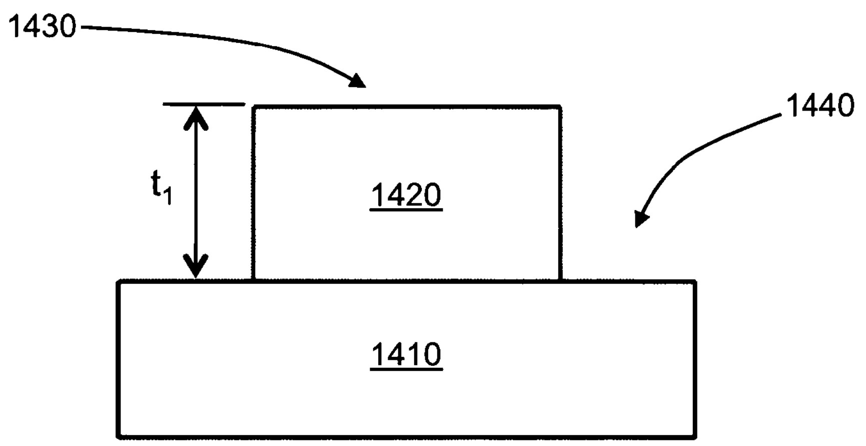
Figure 14C:
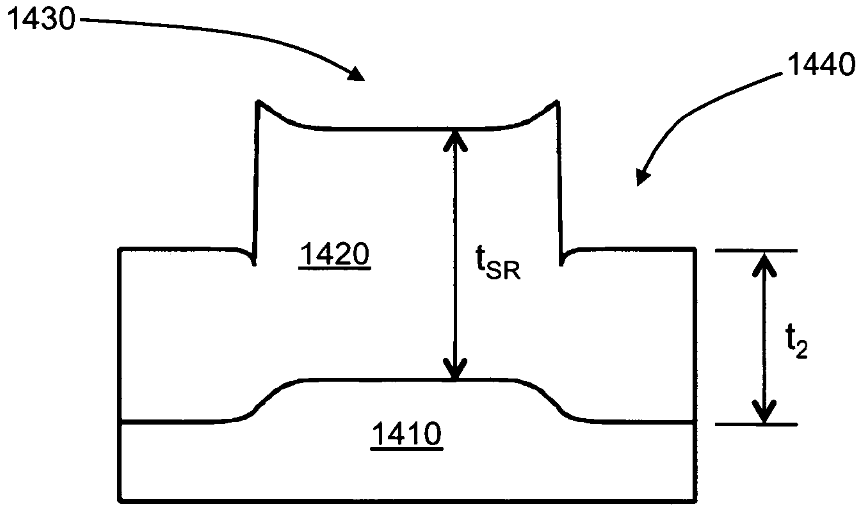
Figure 14D:
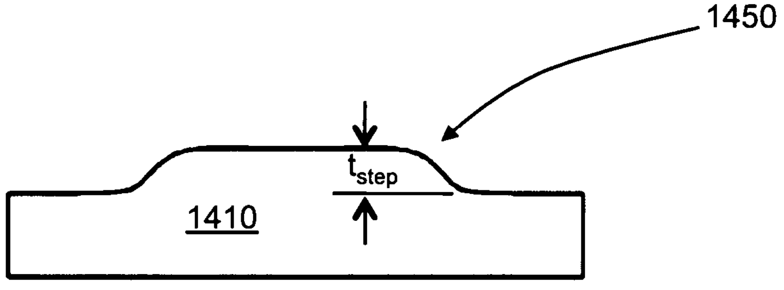

The substrate 1310 is then thermally oxidized to grow temporary oxide posts 1360 at the open region, as shown in FIG. 13C. The oxidation-blocking layer 1330 prevents the substrate 1310 from being oxidized at the step region 1340. In an embodiment, the thermal oxidation lifts the oxidation-blocking layer 1330 to form protrusions 1335. FIG. 13D shows a substrate 1310 with the oxidation-blocking layer 1330 and the oxide 1360 removed, whereby a substrate step 1370 with step thickness $t_{step}$ remains. Since no layers are necessarily placed on the temporary oxide posts 1360, the posts 1360 need not be grown to be taller than the protrusions 1335.

FIG. 14 shows a process of introducing a step in a substrate 1410 without using an oxidation-blocking layer. In FIG. 14A, the substrate 1410 is oxidized to form an oxide layer 1420. This is referred to as a first oxidizing step and is associated with a first oxidation thickness $t_1$. The oxide layer 1420 is then patterned to form an open region 1440 and a step region 1430. The oxide is removed from the open region 1440, as shown in FIG. 14B. FIG. 14C shows a second oxidizing step associated with a second oxidation thickness $t_2$. It is noted that the thickness of the oxide layer 1420 is greater at the step region 1430 than at the open region 1440, i.e. $t_{SR}$ is greater than $t_2$. However, $t_{SR}$ is not necessarily equal to the sum of the first $t_1$ and second $t_2$ oxidation thicknesses due to the nonlinearity of oxidation, as is explained below. Finally, the oxide 1420 is removed, such as through etching, from the substrate 1410 to leave a substrate step 1450 with step height or thickness $t_{step}$. Since $t_{SR}$ is greater than $t_2$, removal of the oxide layer 1420 will generally require over-etching in the open region 1440.

It is important to note that an embodiment of the present invention is directed to fabricating a substrate step using the method of FIG. 14 and minimizing over-etch time at the open region 1440. The over-etch time is related to the difference between $t_{SR}$ and $t_2$. The calculation of this difference can be complicated due to the fact that the thickness of thermally grown oxide is not linearly proportional to oxidation time. For example, when oxidation starts on bare silicon, the oxidation rate is limited by chemical reaction rates between oxygen and silicon. As the oxide layer becomes thicker, oxygen must diffuse through the grown oxide layer to the silicon-oxide interface to react with the silicon. In other words, the diffusion rate through the oxide contributes to the oxidation rate. Thus, oxidation rates decrease as the oxide thickness increases.

Figure 15:
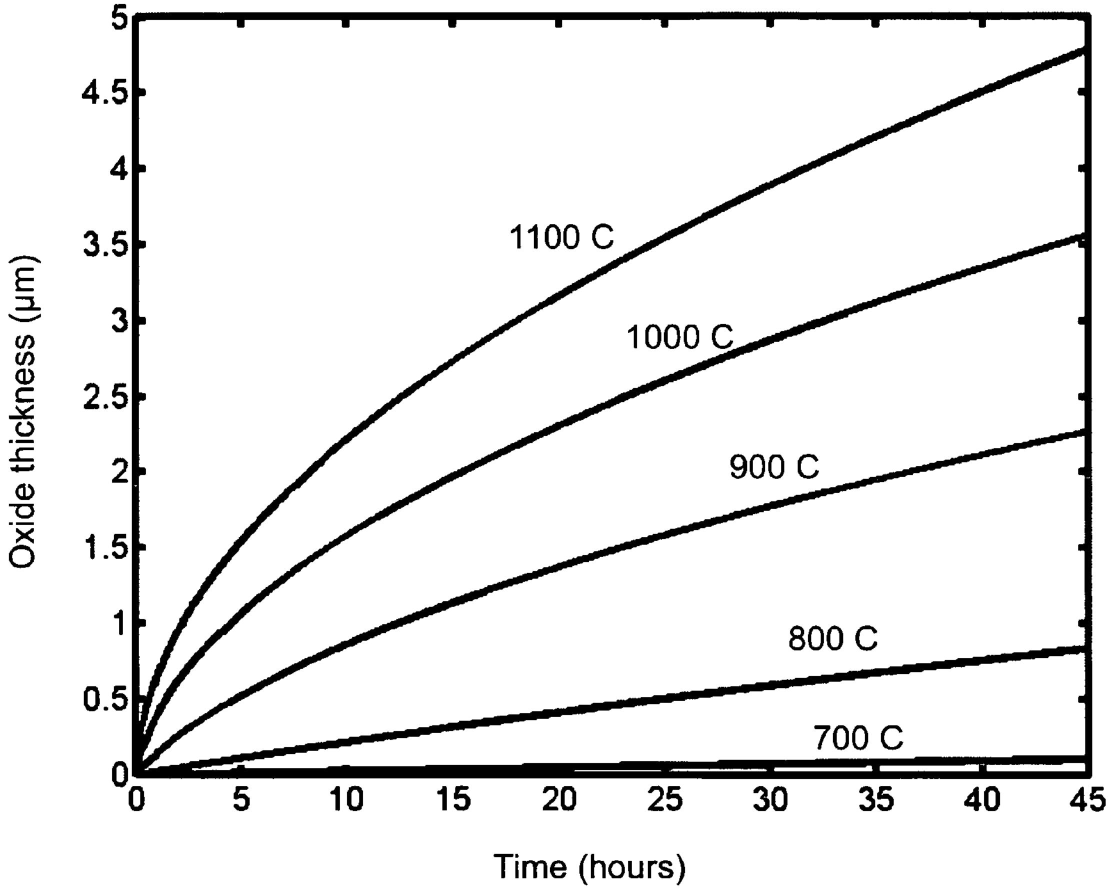
FIG. 15 shows example nonlinear plots of silicon oxide thickness versus time for different wet oxidation temperatures.

FIG. 15 shows example plots of silicon oxide thickness as a function of time for different wet oxidation temperatures. The plots are nonlinear, i.e. the slope is not constant, revealing the dependence of oxidation rates on oxide thickness. An example nonlinear model of oxidation growth is the Deal-Grove oxidation model, which relies on the equation: $(1/B)(x_f^2-x_i^2)+(A/B)(x_f-x_i)=t$, where $x_i$ is the initial oxide thickness, $x_f$ is the final oxide thickness, t is the amount of oxidation time, $B=C_1\exp(-E_1/kT)$, and $B/A=C_2\exp(-E_2/kT)$. T is the oxidation temperature, k is Boltzmann's constant, and $C_1$, $C_2$, $E_1$, and $E_2$ represent oxidation parameters, as shown in Table 1 for different oxidation processes. Oxide thicknesses and/or oxidation times can be calculated based on the Deal-Grove model, however, the present invention is not limited to the Deal-Grove model; other oxidation models can also be applied.

TABLE 1

| Ambient | B | B/A |
|---|---|---|
| Dry $O_2$ | $C_1 = 7.72 \times 10^2\ \mu m^2\ hr^{-1}$ | $C_2 = 6.23 \times 10^6\ \mu m\ hr^{-1}$ |
| | $E_1 = 1.23$ eV | $E_2 = 2.00$ eV |
| Wet $O_2$ | $C_1 = 2.14 \times 10^2\ \mu m^2\ hr^{-1}$ | $C_2 = 8.95 \times 10^7\ \mu m\ hr^{-1}$ |
| | $E_1 = 0.71$ eV | $E_2 = 2.05$ eV |
| $H_2O$ | $C_1 = 3.86 \times 10^2\ \mu m^2\ hr^{-1}$ | $C_2 = 1.63 \times 10^8\ \mu m\ hr^{-1}$ |
| | $E_1 = 0.78$ eV | $E_2 = 2.05$ eV |

Figure 16:
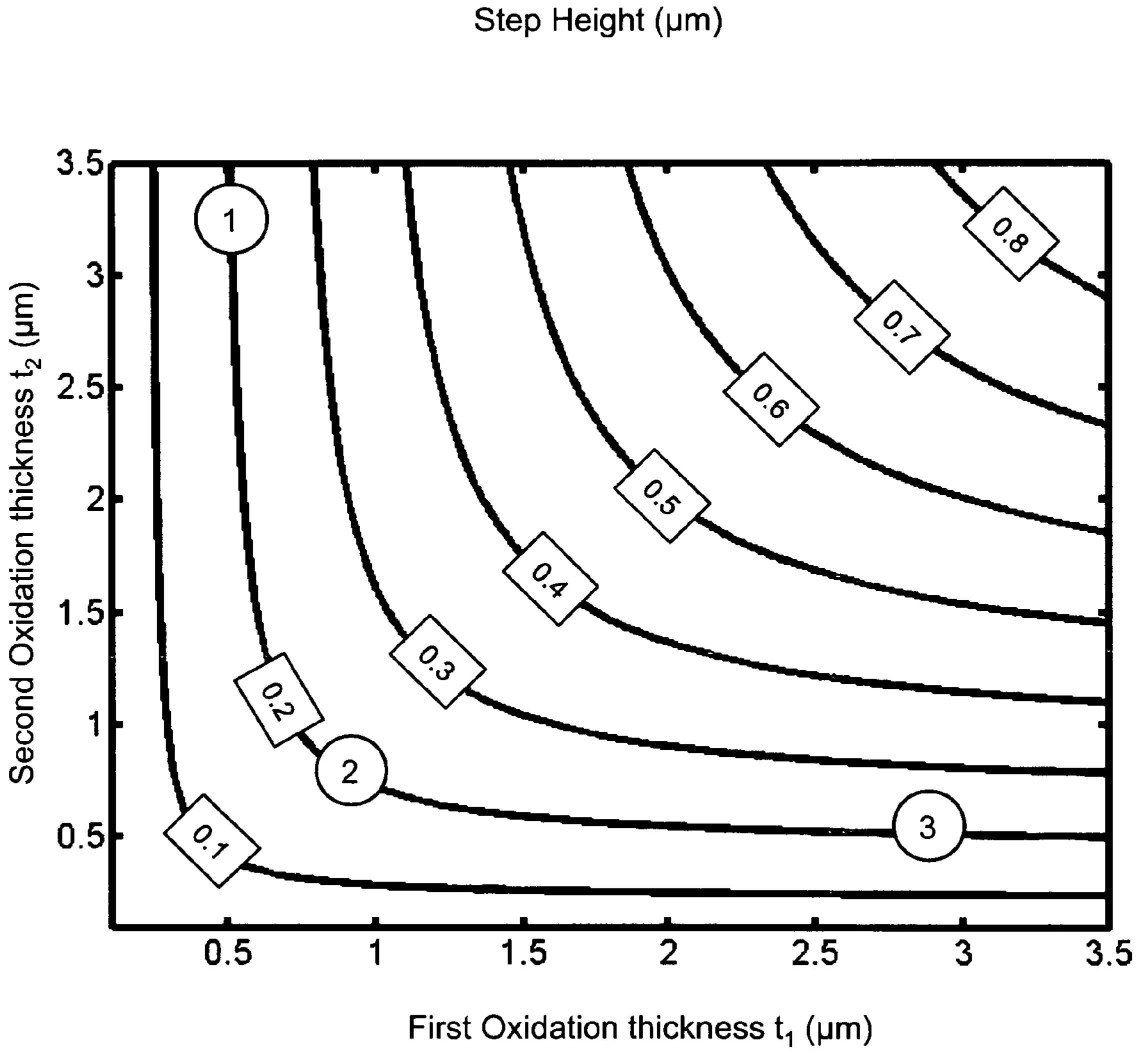
FIG. 16 shows an example of a contour plot of different substrate step heights depending on first and second oxidation thicknesses for silicon oxidation.
Figure 17:
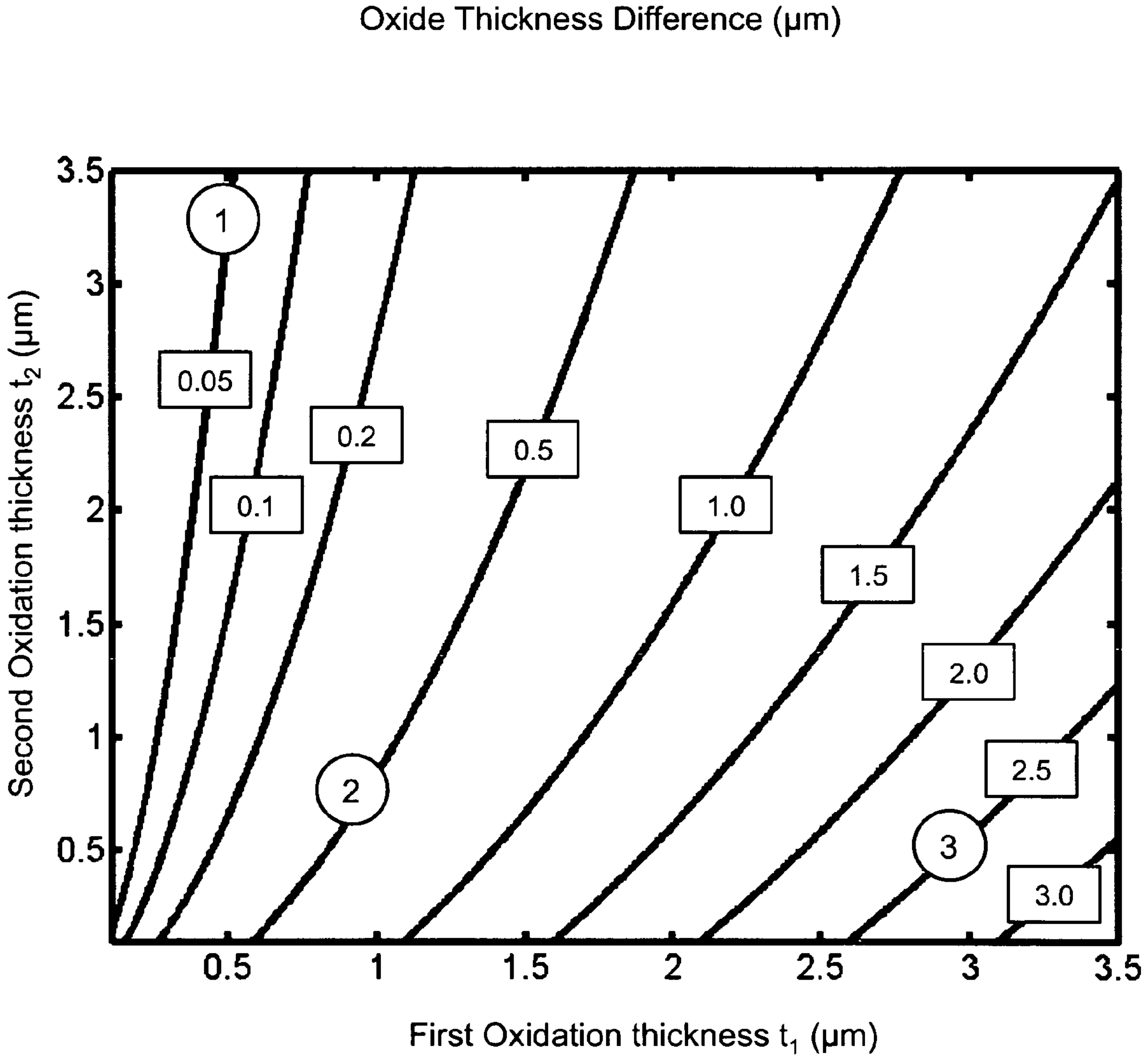
FIG. 17 shows an example of a contour plot of oxide thickness differences depending on first and second oxidation thicknesses for silicon oxidation.

The present invention utilizes the nonlinearity of the oxide growth to minimize the over-etch time. FIG. 16 shows a contour plot for the desired step thickness as a function of the first and second oxidation thicknesses for a silicon substrate. It is noted that a substrate with a specific step thickness can be fabricated by the process of FIG. 14 based on a continuum of choices of $t_1$ and $t_2$. For example, FIG. 16 shows three different cases for fabricating a substrate step thickness of 0.2 μm. FIG. 17 shows a contour plot for the oxide thickness difference as a function of the first and second oxidation thicknesses. FIG. 17 also includes the three different cases shown in FIG. 16. As can be seen in the figures, Case 1 includes the smallest oxide thickness different, thus, the smallest required over-etch time. Table 2 summarizes the results for the three different cases.

TABLE 2

| | $1^{st}$ oxidation thickness $t_1$ (μm) | $2^{nd}$ oxidation thickness $t_2$ (μm) | Difference in oxide thickness (μm) | Over-etch time in 6:1 BOE (min) |
|---|---|---|---|---|
| Case 1 | 0.50 | 3.39 | 0.05 | 0.56 |
| Case 2 | 0.96 | 0.73 | 0.5 | 5.6 |
| Case 3 | 2.97 | 0.52 | 2.5 | 28 |

In a preferred embodiment of fabricating a substrate step using the process of FIG. 14, the first and second oxidation thicknesses are selected to minimize the over-etch time. More particularly, a maximum allowed value for the second oxidation thickness $t_2$ is determined at least partially based on the desired height of the substrate step and a size of a device. For example, if the substrate is to be used in the fabrication of a CMUT, the size of the CMUT and the desired gap thickness can be used to determine the maximum allowed value of $t_2$. After $t_2$ is determined, the first oxidation thickness $t_1$ is calculated at least partially based on the determined $t_2$. In a preferred embodiment, $t_1$ and $t_2$ range from about 10 nm to about 30 μm. The first and second oxidizing steps are performed based on the calculated $t_1$ and determined $t_2$, respectively. The oxide layer can then be removed or etched with minimal over-etch time.

EXAMPLES

CMUTs for HIFU therapy require a thick vacuum gap for high output pressure and a high breakdown voltage. An example HIFU CMUT, similar to the CMUT 700 of FIG. 7E, requires $t_{post}$=2 μm, $t_{in}$=0.2 μm, and $t_{gap}$=0.3 μm. Based on these required thicknesses, a step height of $t_{step}$=0.62 μm is desired. The maximum allowed second oxidation thickness $t_2$=5 μm is determined based on this desired step height $t_{step}$ and the size of the CMUT to be fabricated. The first oxidation thickness $t_1$=1.7 μm is calculated based on the determined $t_2$ and the step height $t_{step}$. The calculated $t_1$ and determined $t_2$ give a 6:1 BOE over-etch time of 3.9 minutes. The substrate step is fabricated following the process of FIG. 14 and the HIFU CMUT is fabricated from the process of FIG. 7.

CMUTs for imaging require a thin vacuum gap for better sensitivity and thick oxide posts for low parasitic capacitance. In addition, a flat substrate step is required for better performance and larger step heights generally result in more rounded substrate steps. An example imaging CMUT, similar to the CMUT 700 of FIG. 7E, requires $t_{in}$=0.1 μm, and $t_{gap}$=0.05 μm. A step height of $t_{step}$=0.2 μm is chosen to ensure a flat step. Based on the above thicknesses, a post thickness of $t_{post}$=0.625 μm is calculated. The maximum allowed second oxidation thickness $t_2$=1.88 μm is determined based on the chosen step height $t_{step}$ and the size of the CMUT to be fabricated. The first oxidation thickness $t_1$=0.56 μm is calculated based on the determined $t_2$ and the step height $t_{step}$. The calculated $t_1$ and determined $t_2$ give a 6:1 BOE over-etch time of 1.1 minutes. The substrate step is fabricated following the process of FIG. 14 and the imaging CMUT is fabricated from the process of FIG. 7.

As one of ordinary skill in the art will appreciate, various changes, substitutions, and alterations could be made or otherwise implemented without departing from the principles of the present invention, e.g. the methods of the present invention can be applied to any device having a vertical critical dimension. Accordingly, the scope of the invention should be determined by the following claims and their legal equivalents.

What is claimed is:

1. A method of fabricating a capacitive micromachined ultrasonic transducer (CMUT), said method comprising:

(a) depositing an oxidation-blocking layer onto a substrate, wherein said substrate comprises an oxidation-enable material;

(b) patterning said oxidation-blocking layer, wherein said patterning forms a post region and a cavity region of a surface of said substrate, and wherein said patterning removes said oxidation-blocking layer from said substrate at said post region;

(c) thermally oxidizing said substrate, wherein said thermally oxidizing grows one or more oxide posts from said post region, and wherein said post defines a vertical dimension of said CMUT; and (d) bonding a membrane layer onto said post, wherein said membrane layer forms a membrane of said CMUT.

2. The method as set forth in claim 1, further comprising oxidizing said substrate before depositing said oxidation-blocking layer onto said substrate, wherein said oxidizing forms an oxide layer on a surface of said substrate, and wherein said patterning removes said oxide layer from said substrate at said post region.

3. The method as set forth in claim 2, further comprising removing some of said oxide layer located at or near the boundary of said post and said cavity region to define a horizontal size of said CMUT.

4. The method as set forth in claim 2, wherein said patterning comprises:

(i) etching said oxidation-blocking layer by wet or dry etching; and (ii) etching said oxide layer by wet etching.

5. The method as set forth in claim 1, wherein said thermally oxidizing said substrate to grow said post forms a protrusion of said oxidation-blocking layer.

6. The method as set forth in claim 5, further comprising removing said protrusion of said oxidation-blocking.

7. The method as set forth in claim 1, further comprising removing approximately all of said oxidation-blocking layer from said cavity region.

8. The method as set forth in claim 7, further comprising removing some of said oxide layer located at or near the boundary of said post and said cavity region to define a horizontal size of said CMUT.

9. The method as set forth in claim 1, wherein said substrate initially comprises a substrate step, and wherein said cavity region to be formed from said patterning at least partially overlaps with said substrate step.

10. The method as set forth in claim 1, further comprising introducing a substrate step to said substrate before depositing said oxidation-blocking layer onto said substrate, wherein said step introducing comprises:

(i) thermally oxidizing said substrate to form an oxide layer on said surface of said substrate;

(ii) patterning said oxide layer to form an open region and a step region, wherein said patterning removes said oxide layer from said substrate at said open region;

(iii) thermally oxidizing said substrate and said patterned oxide layer; and (iv) removing approximately all of said oxide, whereby said substrate remaining has said substrate step, wherein said thermally oxidizing in (i) is referred to as a first oxidizing step and is associated with a first oxidation thickness t, and wherein said thermally oxidizing in (iii) is referred to as a second oxidizing step and is associated with a second oxidation thickness $t_2$.

11. The method as set forth in claim 10, further comprising:
determining a maximum allowed value for $t_2$ based on a desired height of said substrate step and a horizontal size of said CMUT; and
calculating a value for $t_1$, based on said maximum allowed value of $t_2$,
wherein said first oxidizing forms said oxide layer having a thickness approximately equal to said calculated value of $t_1$, and wherein said second oxidizing is based on said maximum allowed value of $t_2$.

12. The method as set forth in claim 1, further comprising introducing a substrate step to said substrate before depositing said oxidation-blocking layer onto said substrate, wherein said step introducing comprises:
(i) depositing a temporary oxidation-blocking layer onto said substrate;
(ii) patterning said temporary oxidation-blocking layer to form an open region and a step region, wherein said patterning removes said temporary oxidation-blocking layer from said substrate at said open region;
(iii) thermally oxidizing said substrate, wherein said thermally oxidizing consumes said oxidation-enable material of said substrate at said open region, and wherein said thermally oxidizing grows one or more temporary oxide posts at said post region; and
(iv) removing approximately all of said temporary oxidation-blocking layer and said temporary oxide posts, whereby said substrate remaining has said substrate step.

13. The method as set forth in claim 12, further comprising oxidizing said substrate before depositing said temporary oxidation-blocking layer onto said substrate, wherein said oxidizing forms an oxide layer on a surface of said substrate, and wherein said patterning removes said oxide layer from said substrate at said open region.

14. The method as set forth in claim 1, wherein said substrate comprises silicon, and wherein said silicon substrate has a surface having a low surface roughness.

15. The method as set forth in claim 1, wherein said oxidation-blocking layer comprises silicon nitride.

16. The method as set forth in claim 1, wherein said membrane layer comprises a material selected from a group consisting of single crystal silicon, polysilicon, silicon carbide, diamond, metal, and silicon nitride.

17. The method as set forth in claim 1, wherein said bonding said membrane layer comprises direct wafer bonding or fusion bonding.

18. The method as set forth in claim 1, wherein said membrane layer is bonded to a top surface of said post, wherein said top surface of said post has a low surface roughness, and wherein said low surface roughness has a root mean square surface deviation less than about 2 nm.

19. A method of fabricating a step on a substrate of a device, wherein said substrate comprises an oxidation-enable material, said method comprising:
(a) determining a maximum allowed second oxidation thickness $t_2$, wherein said determining is at least partially based on a desired height of said step and a size of said device;
(b) calculating a first oxidation thickness $t_1$, wherein said calculating is at least partially based on said determined maximum allowed $t_2$;
(c) thermally oxidizing said substrate to form an oxide layer on a surface of said substrate, wherein the thickness of said oxide layer is based on said calculated $t_1$;
(d) patterning said oxide layer to form an open region and a step region, wherein said patterning removes said oxide layer from said substrate at said open region;
(e) thermally oxidizing said substrate and said patterned oxide layer based on said maximum allowed $t_2$; and
(f) removing approximately all of said oxide, whereby said substrate remaining has a step.

20. The method as set forth in claim 19, wherein said device is a capacitive micromachined ultrasonic transducer (CMUT), and wherein said maximum allowed $t_2$ is determined at least partially based on a horizontal size of said CMUT.

21. The method as set forth in claim 19, wherein said maximum allowed $t_2$ ranges from about 10 nm to about 30 μm, and wherein said calculated $t_1$ ranges from about 10 nm to about 30 μm.

22. The method as set forth in claim 19, wherein said removing approximately all of said oxide comprises etching approximately all of said oxide, wherein said etching comprises over-etching said oxide at said open region for an over-etch time, and wherein said over-etch time is at least partially based on said maximum allowed $t_2$ and said calculated $t_1$.

23. A method of fabricating a device having a vertical critical dimension, said method comprising:
(a) oxidizing a substrate to form an oxide layer on a surface of said substrate, wherein said substrate comprises an oxidation-enable material;
(b) depositing an oxidation-blocking layer on said oxide layer;
(c) patterning said oxidation-blocking layer and said oxide layer, wherein said patterning forms a post region and a cavity region of said surface of said substrate, and wherein said patterning removes said oxidation-blocking layer and said oxide layer from said substrate at said post region;
(d) thermally oxidizing said substrate, wherein said thermally oxidizing grows one or more oxide posts from said post region, and wherein said post defines said vertical critical dimension of said device; and
(e) bonding a membrane layer onto said post, wherein said membrane layer forms a membrane of said device.

* * * * *